United States Patent
Zhu

(10) Patent No.: US 12,191,394 B2
(45) Date of Patent: Jan. 7, 2025

(54) STRAINED VERTICAL CHANNEL SEMICONDUCTOR DEVICE, METHOD OF MANUFACTURING THE SAME, AND ELECTRONIC APPARATUS INCLUDING THE SAME

(71) Applicant: INSTITUTE OF MICROELECTRONICS, CHINESE ACADEMY OF SCIENCES, Beijing (CN)

(72) Inventor: Huilong Zhu, Poughkeepsie, NY (US)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 433 days.

(21) Appl. No.: 17/643,179

(22) Filed: Dec. 7, 2021

(65) Prior Publication Data

US 2022/0190169 A1    Jun. 16, 2022

(30) Foreign Application Priority Data

Dec. 11, 2020   (CN) .......................... 202011462181.1

(51) Int. Cl.
*H01L 29/786*  (2006.01)
*H01L 29/66*   (2006.01)
*H01L 29/78*   (2006.01)

(52) U.S. Cl.
CPC .. *H01L 29/78642* (2013.01); *H01L 29/66545* (2013.01); *H01L 29/66742* (2013.01); *H01L 29/7848* (2013.01); *H01L 29/78696* (2013.01)

(58) Field of Classification Search
None
See application file for complete search history.

(56) References Cited

U.S. PATENT DOCUMENTS 7,999,313 B2 *  8/2011  Kim .................... H01L 29/7827
                                              257/E21.336
9,153,665 B2 * 10/2015  Yu .......................... H10B 12/05
(Continued)

FOREIGN PATENT DOCUMENTS

| CN | 109449158 A | 3/2019 |
| CN | 110993681 A | 4/2020 |
| CN | 111384156 A | 7/2020 |

OTHER PUBLICATIONS

German Office Action dated Feb. 22, 2023, for corresponding German Application No. 10 2021 203 804.7.

(Continued)

*Primary Examiner* — Nishath Yasmeen
(74) *Attorney, Agent, or Firm* — Kinney & Lange, P.A.

(57) ABSTRACT

A strained vertical channel semiconductor device, a method of manufacturing the same, and an electronic apparatus including the same are provided. The method includes: providing a vertical channel layer on a substrate, wherein the vertical channel layer is held by a first supporting layer on a first side in a lateral direction, and is held by a second supporting layer on a second side opposite to the first side; replacing the first supporting layer with a first gate stack while the vertical channel layer is held by the second supporting layer; and replacing the second supporting layer with a second gate stack while the vertical channel layer is held by the first gate stack.

12 Claims, 21 Drawing Sheets

(56) References Cited

U.S. PATENT DOCUMENTS

| | | | |
|---|---|---|---|
| 9,614,077 B1 | 4/2017 | Cheng et al. | |
| 2007/0082448 A1* | 4/2007 | Kim | H01L 29/66666 |
| | | | 257/E21.41 |
| 2007/0246783 A1* | 10/2007 | Moon | H01L 29/66666 |
| | | | 257/E21.627 |
| 2014/0264754 A1* | 9/2014 | Surthi | H01L 21/2257 |
| | | | 438/542 |
| 2017/0365714 A1* | 12/2017 | Bu | H01L 29/66356 |
| 2018/0097111 A1* | 4/2018 | Zhu | H01L 29/78696 |
| 2018/0108577 A1* | 4/2018 | Zhu | H01L 29/42376 |
| 2018/0175193 A1* | 6/2018 | Raghavan | H01L 29/7827 |
| 2019/0019917 A1* | 1/2019 | Jain | H01L 33/12 |
| 2019/0148360 A1* | 5/2019 | Cheng | H01L 29/66174 |
| | | | 257/296 |
| 2020/0357795 A1* | 11/2020 | Zhu | H01L 21/823487 |

OTHER PUBLICATIONS

Chinese Office Action dated Dec. 5, 2023, for corresponding Chinese Application No. 202011462181.1.

\* cited by examiner

STRAINED VERTICAL CHANNEL SEMICONDUCTOR DEVICE, METHOD OF MANUFACTURING THE SAME, AND ELECTRONIC APPARATUS INCLUDING THE SAME

CROSS-REFERENCE TO RELATED APPLICATION(S)

This application claims priority to Chinese Patent Application No. 202011462181.1 filed on Dec. 11, 2020, which is incorporated herein by reference in its entirety.

TECHNICAL FIELD

The present disclosure relates to a field of semiconductors, and more particularly to a semiconductor device with a strained vertical channel portion, a method of manufacturing the semiconductor device and an electronic apparatus including the semiconductor device.

BACKGROUND

With the continuous miniaturization of semiconductor devices, devices of various structures such as fin field effect transistors (FinFET), multi-bridge channel field effect transistors (MBCFET), etc. have been proposed. However, improved space of these devices in terms of increasing integration density and enhancing device performance still cannot meet the requirements due to the limitations of the device structure.

In addition, due to process fluctuations such as photolithography and etching, it is difficult for vertical nanosheets or nanowire devices such as metal oxide semiconductor field effect transistors (MOSFETs) to control the thickness or diameter of the nanosheets or nanowires. Moreover, it is difficult to introduce stress in the vertical device to further improve the device performance.

SUMMARY

In view of this, the purpose of the present disclosure is to at least provide a semiconductor device with a strained vertical channel portion, a method of manufacturing the semiconductor device and an electronic apparatus including the semiconductor device.

According to an aspect of the present disclosure, a semiconductor device is provided, including: a vertical channel portion on a substrate; source/drain portions respectively located at an upper end and a lower end of the channel portion with respect to the substrate; and a first gate stack on a first side of the channel portion in a lateral direction, and a second gate stack on a second side of the channel portion in the lateral direction, wherein the second side is opposite to the first side, wherein a first gate dielectric layer in the first gate stack partially overlaps with a second gate dielectric layer in the second gate stack.

According to another aspect of the present disclosure, a method of manufacturing a semiconductor device is provided, including: providing a vertical channel layer on a substrate, wherein the vertical channel layer is held by a first supporting layer on a first side in a lateral direction, and is held by a second supporting layer on a second side opposite to the first side; replacing the first supporting layer with a first gate stack while the vertical channel layer is held by the second supporting layer; and replacing the second supporting layer with a second gate stack while the vertical channel layer is held by the first gate stack.

According to another aspect of the present disclosure, an electronic apparatus is provided, including the semiconductor device described above.

BRIEF DESCRIPTION OF THE DRAWINGS

Through the following description of embodiments of the present disclosure with reference to the accompanying drawings, the above and other objectives, features, and advantages of the present disclosure will become more apparent. In the accompanying drawings:

FIGS. 1 to 25(b) schematically show some stages in a process of manufacturing a semiconductor device according to the embodiments of the present disclosure, wherein:

FIGS. 1 to 4, 5(b), 6(b), 7-9, 10(a), 10(b), 11-13, 14(a), 14(b), 15(a), 16, 17, 18(b), 19(a), 20, 21(b), 22(b), 23(b), 24(a), 25(a), 25(b) are cross-sectional views taken along line AA';

Throughout the drawings, the same or similar reference numerals indicate the same or similar components.

DETAILED DESCRIPTION OF EMBODIMENTS

Figure 1:
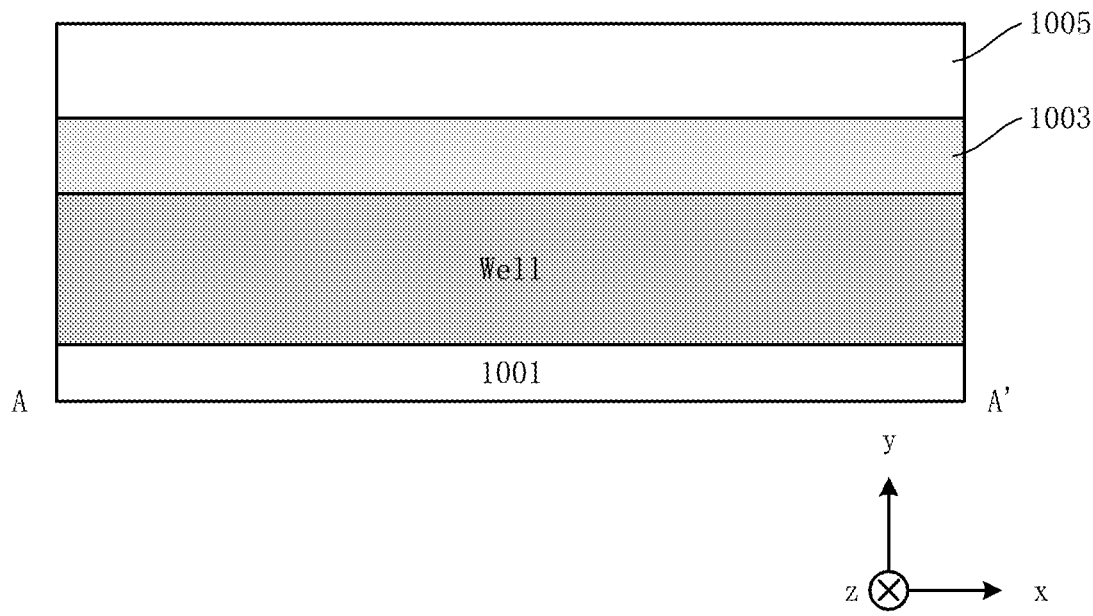

Hereinafter, the embodiments of the present disclosure will be described with reference to the drawings. However, it should be understood that these descriptions are only exemplary, and are not intended to limit the scope of the present disclosure. In addition, in the following description, descriptions of well-known structures and technologies are omitted to avoid unnecessarily obscuring the concept of the present disclosure.

Various structural schematic diagrams according to the embodiments of the present disclosure are shown in the accompanying drawings. These drawings are not drawn to scale, some details are enlarged and some details may be omitted for clarity of presentation. Shapes of various regions and layers shown in the drawings, as well as the relative size and positional relationship between them are only exemplary. In practice, there may be deviations due to manufacturing tolerances or technical limitations. Areas/layers with different shapes, sizes, and relative positions can be designed by those skilled in the art according to actual needs.

In the context of the present disclosure, when a layer/element is referred to as being "on" another layer/element, the layer/element may be directly on the another layer/element, or there may be an intervening level/component. In addition, if a layer/element is located "on" another layer/element in one orientation, the layer/element may be located "under" the another layer/element when the orientation is reversed.

According to the embodiments of the present disclosure, there is provided a vertical semiconductor device with an active region arranged vertically on a substrate (for example, in a direction substantially perpendicular to a surface of the substrate). A channel portion may be a vertical nanosheet or nanowire, such as a curved nanosheet or nanowire with a C-shaped cross section (for example, a cross section perpendicular to the surface of the substrate), so this device may be referred as a C-channel field effect transistor (C-Channel FET, or CCFET). As will be described below, the nanosheet or nanowire can be formed by epitaxial growth, and therefore can be a single piece, and can have a substantially uniform thickness. The channel portion may have strain or stress in a vertical direction. Due to this strain, a lattice constant of a material of the channel portion is different from a lattice constant of this material without being strained.

The semiconductor device may further include source/drain portions respectively provided at the upper and lower ends of the channel portion. Dimensions of the source/drain portions in a lateral direction relative to the substrate may be greater than a dimension of the channel portion in the corresponding direction to ensure that the upper and lower ends of the channel portion are connected to the source/drain portions. The source/drain portions may have certain doping. For example, for a p-type device, the source/drain portions may have p-type doping; for an n-type device, the source/drain portions may have n-type doping. The channel portion may have certain doping to adjust a threshold voltage of the device. Alternatively, the semiconductor device may be a junctionless device, in which the channel portion and the source/drain portions may have a same conductivity type doping. Alternatively, the semiconductor device may be a tunneling device, in which the source/drain portions at two ends of the channel portion may have doping types opposite to each other.

The source/drain portions may be provided in a corresponding semiconductor layer. For example, the source/drain portions may be a doped region in the corresponding semiconductor layer. The source/drain portions may be a part or whole of the corresponding semiconductor layer. In a case that the source/drain portions are a part of the corresponding semiconductor layer, a doping concentration interface may exist between the source/drain portions and a remaining portion of the corresponding semiconductor layer. As will be described below, the source/drain portions may be formed by diffusion doping. In this case, the doping concentration interface may be substantially in a vertical direction relative to the substrate.

The channel portion may include a single crystal semiconductor material. The source/drain portions or the semiconductor layer on which they are formed may also include a single crystal semiconductor material. For example, the channel portion and the source/drain portions can be formed by epitaxial growth.

The semiconductor device may further include a gate stack arranged on an outer periphery of the channel portion, and the gate stack may surround the outer periphery of the channel portion. Therefore, the semiconductor device according to the embodiment of the present disclosure may be a surrounding-gate device. According to an embodiment of the present disclosure, the gate stack may be self-aligned to the channel portion. For example, at least a part of the gate stack close to the channel portion may be substantially coplanar with the channel portion, for example, the part of the gate stack and an upper surface and/or a lower surface of the channel portion are substantially coplanar with each other.

According to the embodiments of the present disclosure, gate stacks on opposite sides of the channel portion may be formed separately. Thus, respective gate dielectric layers of the separately formed gate stacks may partially overlap. In addition, respective gate conductor layers of the separately formed gate stacks may be connected to each other.

Such a semiconductor device can be manufactured as follows, for example.

According to the embodiments, a vertical channel layer may be provided on the substrate. The provision of the vertical channel layer may depend on a (vertical) sidewall of a sacrificial layer, for example, by epitaxial growth on the sidewall of the sacrificial layer. Supporting layers may be provided on opposite sides of the channel layer in the lateral direction, respectively. For example, the sacrificial layer itself or a position holding layer replacing the sacrificial layer may be one of the supporting layers.

When forming the gate stack, the opposite sides of the channel layer in the lateral direction may be respectively processed. For example, it is possible to replace the supporting layer on one side with a first gate stack while being held by the supporting layer on the other side; then, while the side is held by the first gate stack, the supporting layer on the other side is replaced with a second gate stack. This can suppress a stress release in the channel layer. For the purpose of self-alignment, the channel layer formed on the sidewall of the sacrificial layer can be relatively recessed with respect to the upper and lower material layers, and the first gate stack and the second gate stack can be embedded in the recesses.

According to the embodiments, a stack of a first material layer, a second material layer (the aforementioned sacrificial layer), and a third material layer may be provided on the substrate. The first material layer may define a position of a lower end of the source/drain portions, the second material layer may define a position of the gate stack, and the third material layer may define a position of an upper end of the source/drain portions. The first material layer may be provided through the substrate such as the upper part of the substrate, and the second material layer and the third material layer may be sequentially formed on the first material layer by, for example, epitaxial growth. Alternatively, the first material layer, the second material layer, and the third material layer may be sequentially formed on the substrate by, for example, epitaxial growth. The first material layer and the third material layer may be doped in situ while being epitaxially grown, so as to form the source/drain portions therein.

A semiconductor device can be manufactured based on the stack. The stack may include first and second sides opposite to each other and third and fourth sides opposite to each other. For example, the stack may be quadrangular, such as a rectangle or a square in a top view.

In order to better define a gate length or to form a self-aligned gate stack, through the selective etching, a sidewall of the second material layer on a first side can be recessed laterally relative to sidewalls of the first material layer and the third material layer, so as to form a recessed portion. The recessed portion may have a curved surface that is recessed toward an inner side of the stack. When forming the recessed portion, other sidewalls of the stack, especially a sidewall on the second side opposite to the first side, may be shielded by a shielding material.

A channel layer may be formed on a surface of the recessed portion. For example, a first active layer may be formed by epitaxial growth on an exposed surface of the stack, and a part of the first active layer located on the surface of the recessed portion may be used as a channel portion (may also be referred to as the "channel layer"). A lattice constant of a material of the channel layer without being strained may be different from a lattice constant of a material of the second material layer without being strained, so that strain or stress may be generated in the channel layer.

The position holding layer may be formed in the recessed portion where the channel layer is formed on the surface.

Before forming the recessed portion on the first side, it is also possible to similarly form recessed portions on the third side and the fourth side and form position holding layers therein. This helps to improve morphology and dimension control of the channel layer.

These position holding layers can then be replaced with gate stacks (referred to as first gate stacks). When forming the first gate stack, the channel layer can be held by the second material layer so that a stress release therein can be suppressed.

After that, the second material layer may be removed from the second side, and a gate stack (referred to as a second gate stack) may be formed therein. When removing the second material layer, the channel layer is held by the first gate stack so that the stress release therein can be suppressed.

Alternatively, the second material layer may be removed from the second side first, and another position holding layer may be formed in a recessed portion thus obtained. Therefore, the position holding layer and the another position holding layer can be respectively provided on opposite sides of the channel layer. Due to the existence of the position holding layers, the source/drain portions can be easily processed. After that, the position holding layer and the another position holding layer may be replaced with gate stacks, respectively.

According to other embodiments, a stack of the first material layer, the second material layer, and the third material layer may be patterned into a ridge structure. The ridge structure may include first and second sides opposite to each other, and third and fourth sides opposite to each other. For example, the ridge structure may have a quadrangular shape such as a rectangle or a square in a plan view. The channel portion may be formed on a pair of opposite sidewalls (for example, the first side and the second side) of the ridge structure.

In order to subsequently form the gate stack surrounding the channel portion, a space for forming the gate stack may be defined on the third side and the fourth side of the ridge structure. For example, the sidewall of the second material layer may be recessed laterally relative to the sidewalls of the first material layer and the third material layer on the third side and the fourth side of the ridge structure, thereby defining a first recessed portion. The first recessed portion may have a curved surface recessed toward an inner side of the ridge structure. The first position holding layer may be formed in the first recessed portion.

Similarly, the sidewall of the second material layer may be recessed laterally relative to the sidewalls of the first material layer and the third material layer on the first side and the second side of the ridge structure, thereby defining a second recessed portion, so as to define a space for the gate stack. The second recessed portion may have a curved surface recessed toward the inner side of the ridge structure. The channel portion may be formed on a surface of the second recessed portion. For example, the first active layer may be formed by epitaxial growth on an exposed surface of the ridge structure, and a part of the first active layer located on the surface of the second recessed portion may be used as the channel portion (also referred to as a channel layer). One device may be formed based on the first active layer on each of the sidewalls of the first side and the second side of the ridge structure. Thus, based on a single ridge structure, two devices opposite to each other may be formed.

After the second recessed portion is defined and before the first active layer is formed, the exposed surface of the ridge structure may be etched back by a certain amount, for example, substantially a thickness of the first active layer to be formed. This helps to ensure that the subsequently formed gate stack has substantially equal gate lengths on opposite sides of the channel portion.

The source/drain portions may be formed in the first material layer and the third material layer. For example, the source/drain portions may be formed by doping the first material layer and the third material layer (especially in the case they are not doped when they are formed). This doping may be achieved by a solid phase dopant source layer. A second position holding layer may be formed in the second recessed portion where the channel layer is formed on the surface to prevent the dopant from diffusing into the channel portion.

The first position holding layer and the second position holding layer may be removed, and the first gate stack may be formed.

An opening may be formed in the ridge structure to separate the active regions of the two devices. The opening may also extend substantially along the sidewalls of the first side or the second side of the ridge structure, so that the ridge structure is divided into two parts on the first side and the second side, and the two parts have their respective channels. The second material layer may be removed through the opening, and a second gate stack may be formed. The first gate stack and the second gate stack may be connected to each other so as to surround the channel portion.

According to the embodiments of the present disclosure, the thickness of the nanosheets or nanowires used as the channel portion and the gate length are mainly determined by epitaxial growth, rather than by etching or photolithography, so it is possible to have a good channel dimension/thickness and gate length control.

The present disclosure may be presented in various forms, some examples of which will be described below. In the following description, a selection of various materials is involved. In addition to the functions (for example, semiconductor materials are used to form the active region and dielectric materials are used to form electrical isolation), the selection of materials also considers etching selectivity. In the following description, required etching selectivity may or may not be indicated. It should be clear to those skilled in the art that when it is mentioned below that a certain material layer is etched, if it is not mentioned that other layers are also etched or the drawings does not show that other layers are also etched, then this etching may be selective, and the material layer may have etching selectivity relative to other layers exposed to a same etching recipe.

FIGS. 1 to 25(b) schematically show some stages in a process of manufacturing a semiconductor device according to the embodiments of the present disclosure.

As shown in FIG. 1, a substrate 1001 is provided (an upper part of which may constitute the above-mentioned first material layer). The substrate 1001 may be a substrate of various forms, including but not limited to a bulk semiconductor material substrate such as a bulk Si substrate, a semiconductor-on-insulator (SOI) substrate, a compound semiconductor substrate such as a SiGe substrate, and the like. In the following description, for ease of description, a bulk Si substrate is taken as an example for description. Here, a silicon wafer is provided as the substrate 1001.

A well region may be formed in the substrate 1001. If a p-type device is to be formed, the well region may be an n-type well; if an n-type device is to be formed, the well region may be a p-type well. The well region may be formed, for example, by injecting corresponding conductivity type dopants (p-type dopants such as B or In, or n-type dopants such as As or P) into the substrate 1001 and then thermal annealing. There are many ways to provide such a well region in the art, which will not be repeated here.

A second material layer 1003 and a third material layer 1005 may be formed on the substrate 1001 by, for example, epitaxial growth. The second material layer 1003 may be used to define a position of the gate stack, and a thickness of the second material layer is within a range of, for example, about 20 nm to 50 nm. The third material layer 1005 may be used to define a position of an upper end of source/drain portions, and a thickness of the third material layer is within a range of, for example, about 20 nm to 200 nm.

The substrate 1001 and adjacent ones of the above-mentioned layers formed on the substrate 1001 may have etching selectivity with respect to each other. For example, in case that the substrate 1001 is a silicon wafer, the second material layer 1003 may include SiGe (for example, an atomic percentage of Ge is about 10% to 30%), and the third material layer 1005 may include Si.

Lateral directions x, z and a vertical direction y are schematically shown in FIG. 1. The x and z directions may be within a top surface of the substrate 1001 and may be perpendicular to each other; the y direction may be substantially perpendicular to the top surface of the substrate 1001. Since the top is not constrained, stress of the second material layer 1003 in the y direction may be released.

Figure 2:
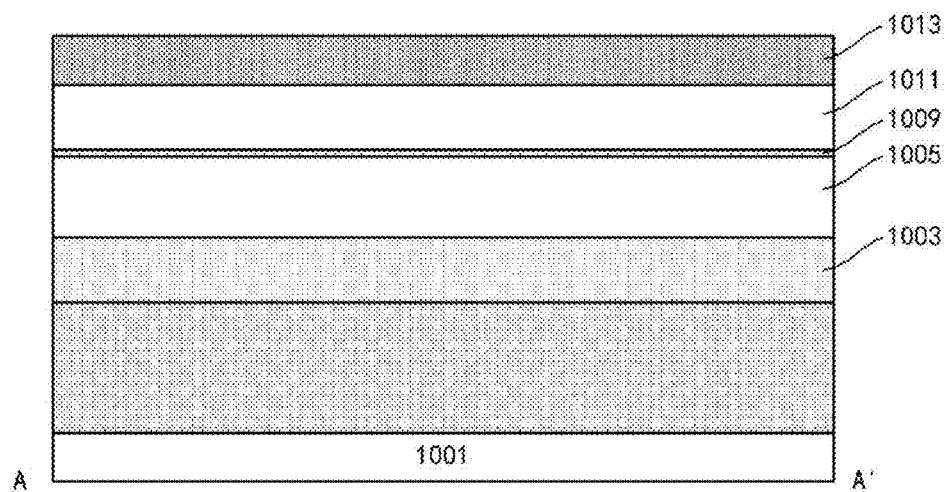

According to the embodiments, spacer graphic transfer technology is used in the following patterning. In order to form the spacer, a mandrel may be formed. For example, as shown in FIG. 2, a layer 1011 used for a mandrel may be formed on the third material layer 1005 by, for example, deposition. For example, the layer 1011 used for the mandrel may include amorphous silicon or polysilicon, with a thickness ranging from about 50 nm to 150 nm. In addition, for better etching control, an etching stop layer 1009 may be formed first by, for example, deposition. For example, the etching stop layer 1009 may include oxide (for example, silicon oxide), with a thickness ranging from about 1 nm to 10 nm.

A hard mask layer 1013 may be formed on the layer 1011 used for the mandrel by, for example, deposition. For example, the hard mask layer 1013 may include nitride (for example, silicon nitride), with a thickness ranging from about 30 nm to 100 nm.

The layer 1011 used for the mandrel may be patterned into a mandrel.

Figure 3:
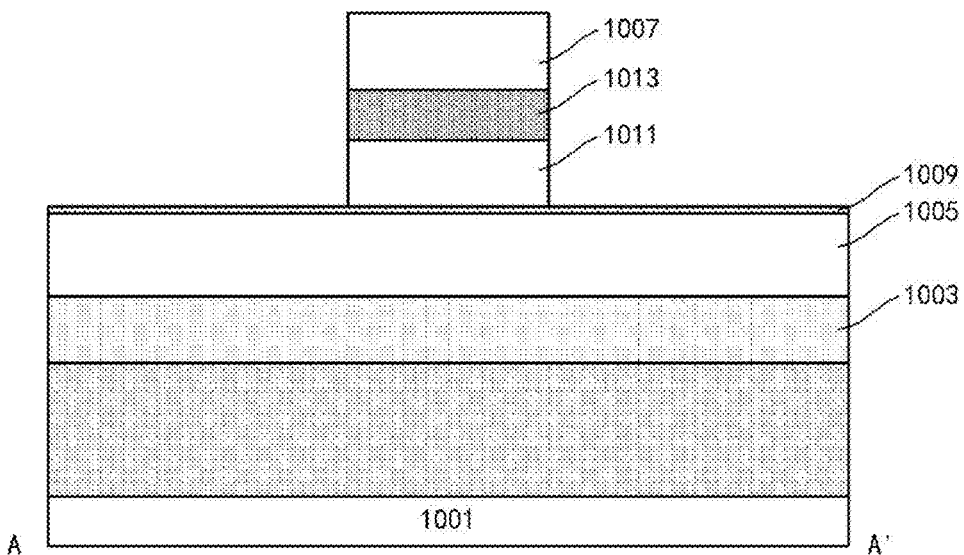

For example, as shown in FIG. 3, a photoresist 1007 may be formed on the hard mask layer 1013, and patterned by photolithography to be a strip extending in a first direction (a direction perpendicular to the paper plane of FIG. 3, such as the above-mentioned z direction). The photoresist 1007 may be used as an etching mask, and the hard mask layer 1013 and the layer 1011 used for the mandrel may be selectively etched by, for example, reactive ion etching (RIE), and a pattern of the photoresist is transferred to the hard mask layer 1013 and the layer 1011 used for the mandrel. RIE may be performed in a substantially vertical direction, and may stop at the etching stop layer 1009. After that, the photoresist 1007 may be removed.

Figure 4:
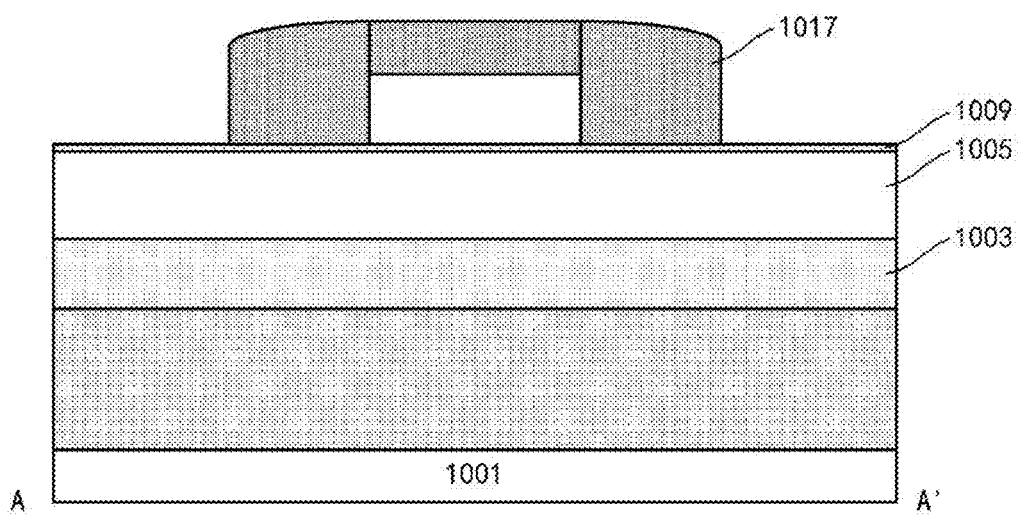

As shown in FIG. 4, a spacer 1017 may be formed on two opposite sidewalls of the mandrel in a second direction (a horizontal direction in the paper plane of FIG. 4, such as the above-mentioned x direction) intersecting (for example, perpendicular to) the first direction. For example, a layer of nitride with a thickness ranging from about 10 nm to 100 nm may be deposited in a substantially conformal manner, and then the deposited nitride layer may be anisotropically etched, such as RIE, in the vertical direction (which may be performed in a substantially vertical direction, and may stop at the etching stop layer 1009) to remove its lateral extension part and leave its vertical extension part, so as to obtain the spacer 1017. The spacer 1017 may then be used to define the position of the active region of the device.

The mandrel formed as described above and the spacer 1017 formed on the sidewalls thereof extend in the first direction (z direction). It is possible to define their range in the first direction, and thus define a range of the active region of the device in the first direction.

Figure 5A:
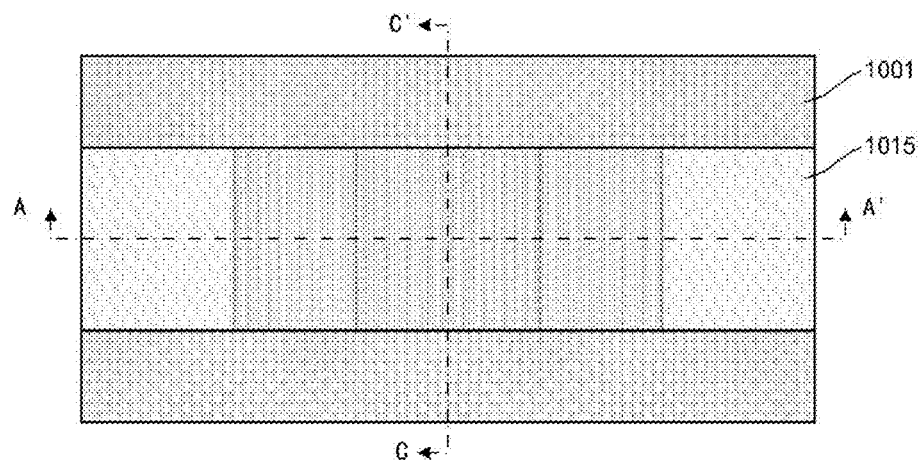
FIGS. 5(a), 6(a), 18(a), 21(a), 22(a), 23(a) are top views.
Figure 5B:
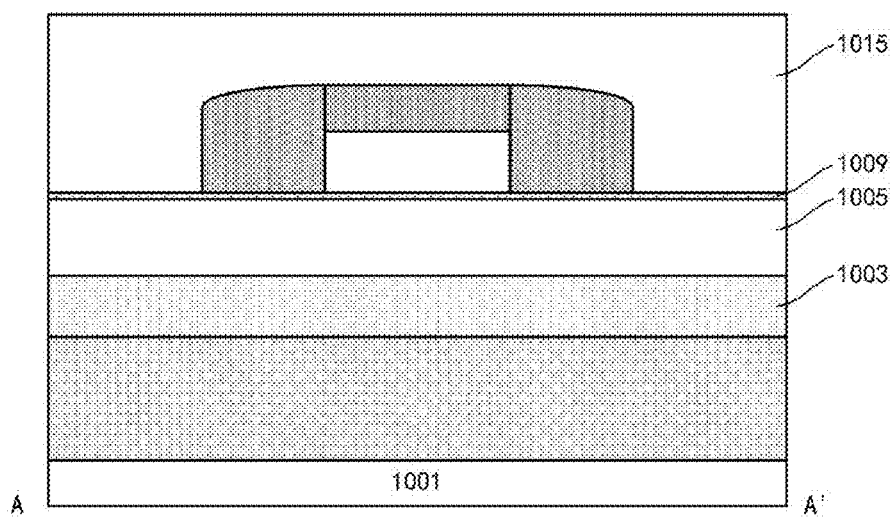
Figure 5C:
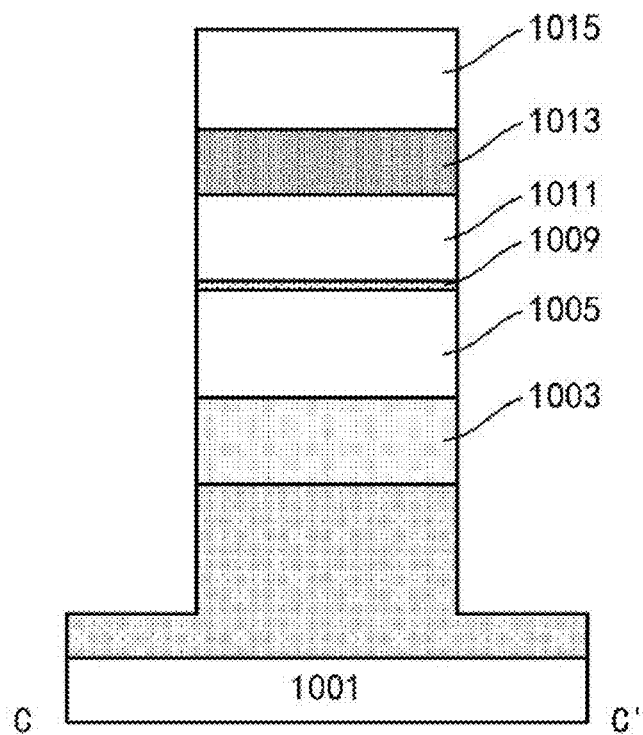
FIGS. 5(c) and 6(d) are cross-sectional views taken along line CC'.

As shown in FIGS. 5(a) to 5(c), a photoresist 1015 may be formed on the structure shown in FIG. 4, and patterned by photolithography to occupy a certain range in the first direction (z direction), for example, formed to a strip extending in a second direction (x direction) perpendicular to the first direction. The photoresist 1015 may be used as an etching mask, and the underlying layers may be selectively etched sequentially by, for example, RIE. The etching may be performed into the substrate 1001, particularly the well region therein, so as to form a groove in the substrate 1001. An isolation, such as shallow trench isolation (STI) may be subsequently formed in the formed groove. After that, the photoresist 1015 may be removed.

As shown in FIG. 5(c), sidewalls of the second material layer 1003 in the first direction (z direction) are currently exposed to the outside.

According to the embodiments of the present disclosure, in order to form the gate stack surrounding the channel portion, a space for the gate stack may be left at two ends of the second material layer in the first direction (z direction).

Figure 6A:
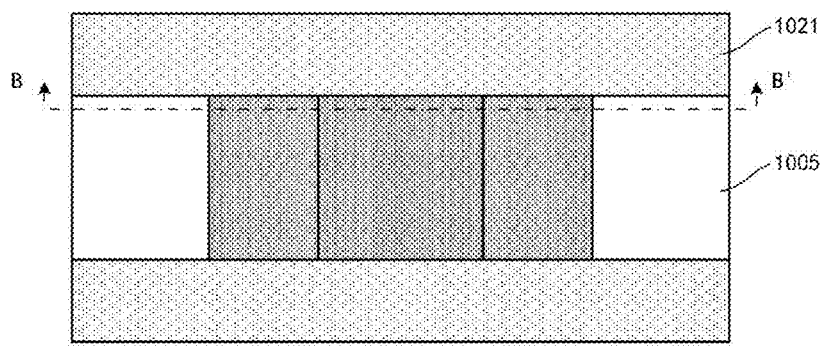
Figure 6B:
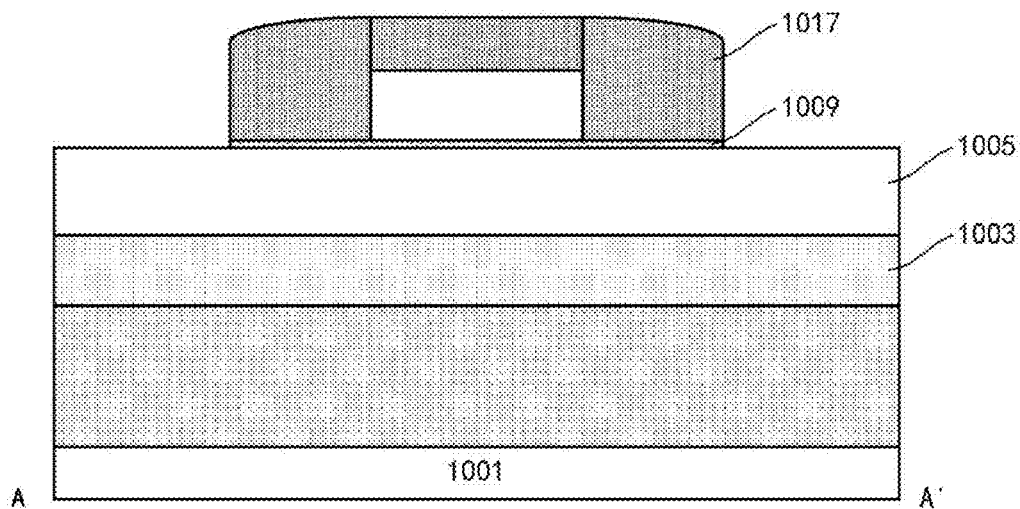
Figure 6C:
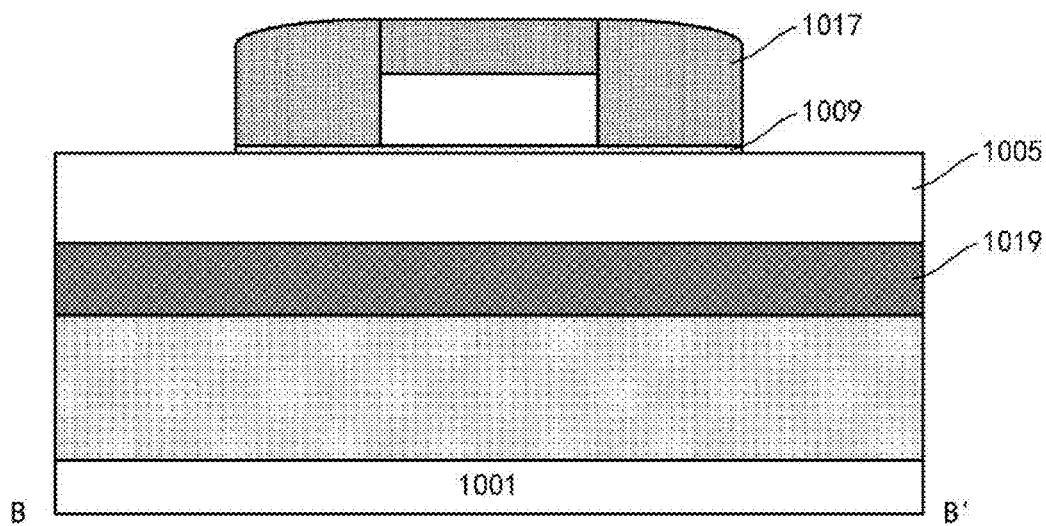
FIG. 6(c) is a cross-sectional view taken along line BB'.
Figure 6D:
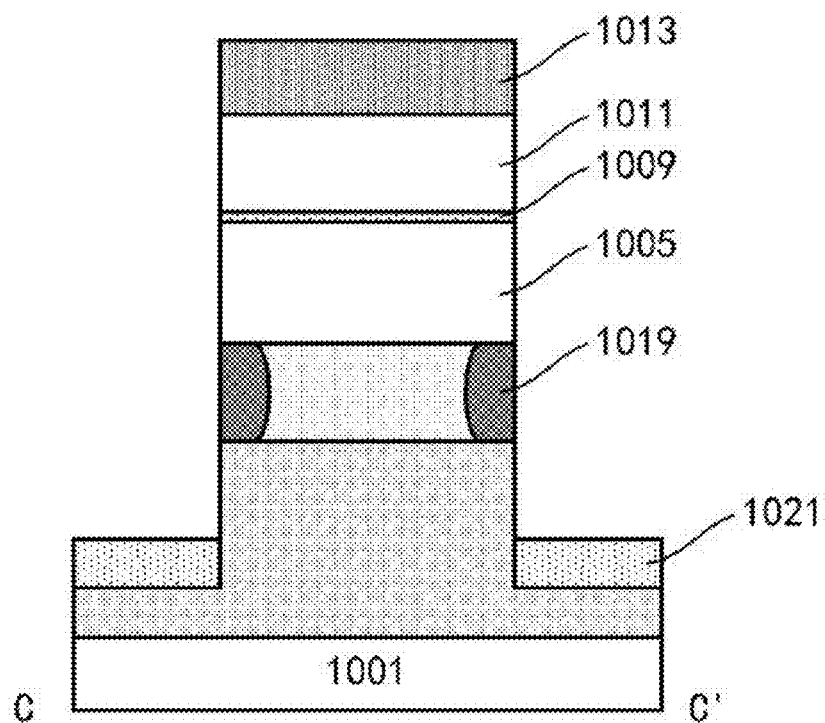

As shown in FIGS. 6(a) to 6(d), the second material layer 1003 may be selectively etched so that the sidewalls thereof in the first direction (z direction) are relatively recessed. In order to better control an amount of etching, atomic layer etching (ALE) may be used. For example, the amount of etching may be within a range of about 5 nm to 20 nm. Depending on characteristics of the etching, for example, etching selectivity of the second material layer 1003 relative to the substrate 1001 and the third material layer 1005, the sidewalls of the second material layer 1003 after etching may have different shapes. FIG. 6(d) shows that the sidewalls of the second material layer 1003 after etching has an inwardly recessed C shape. However, the embodiments of the present disclosure are not limited to this. For example, when the etching selectivity is good, the sidewalls of the second material layer 1003 after etching may be close to vertical. The etching may be isotropic, especially when a larger etching amount is required. In the thus formed recess, a dielectric material may be filled to define the space of the gate stack. This filling may be performed by deposition and then etching back. For example, a dielectric material such as SiC sufficient to fill the recess may be deposited on the substrate, and then the deposited dielectric material may be etched back such as RIE. In this way, the dielectric material outside the range defined by the hard mask layer 1013 and the spacer 1017 may be removed, and the dielectric material is left in the above-mentioned recess to form a first position holding layer 1019.

According to the embodiments of the present disclosure, a protective layer 1021 may also be formed on the substrate 1001. For example, an oxide layer may be formed on the substrate 1001 by deposition, and the deposited oxide layer may be planarized, such as chemical mechanical polishing (CMP) (CMP may stop at the hard mask layer 1013), and then etched back to form a protective layer 1021. The protective layer 1021 may be located in the groove of the substrate 1001, and a top surface of the protective layer 1021 is lower than the top surface of the substrate 1001. In addition, during the etching back process, an exposed part of the etching stop layer 1009 (in this example, also includes oxide) may also be etched. According to other embodiments, the operation of forming the protective layer 1021 may be performed before the operation (including recessing and filling) of forming the first position holding layer 1019.

The protective layer 1021 may protect the surface of the substrate 1001. For example, in this example, the range of the active region in the first direction (z direction) is first defined. Then, the range of the active region in the second direction (x direction) is defined. The protective layer 1021 may also avoid affecting the surface (see FIG. 5(c)) of the groove in the substrate currently exposed to the outside when defining the range in the second direction (x direction). In addition, in case that different types of well regions are formed in the substrate 1001, the protective layer 1021 may protect pn junctions between the different types of well regions from being damaged by etching (for example, etching back when forming the first position holding layer 1019).

Figure 7:
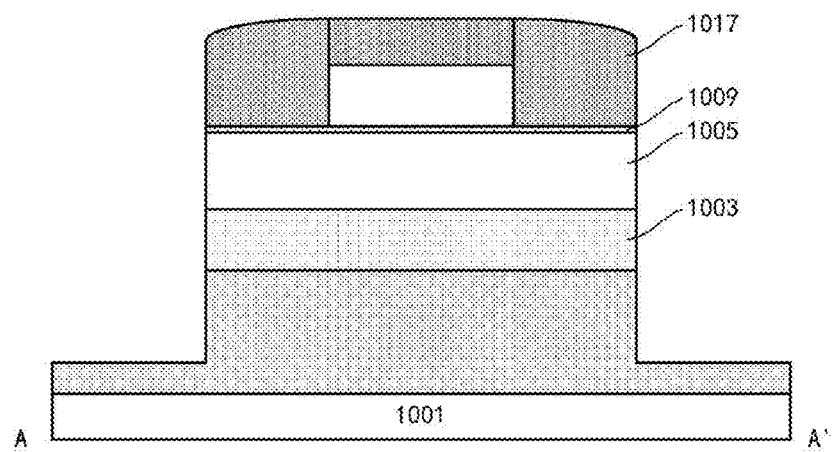

As shown in FIG. 7, the hard mask layer 1013 and the spacer 1017 may be used to pattern the third material layer 1005, the second material layer 1003 and the upper part of the substrate 1001 (the first material layer) into a ridge structure (a range of the ridge structure in the first direction has been defined by the above processing). For example, the hard mask layer 1013 and the spacer 1017 may be used as an etching mask, and each layer is selectively etched sequentially by, for example, RIE, to transfer the pattern to the layer underneath. Thus, the upper part of the substrate 1001, the second material layer 1003, and the third material layer 1005 may form the ridge structure. As described above, due to the existence of the protective layer 1021, the etching may not affect parts of the substrate 1001 on two sides of the ridge structure in the first direction (z direction).

The etching may be performed to the well region of the substrate 1001. A degree of etching into the substrate 1001 may be substantially the same or similar to a degree of the etching into the substrate 1001 described with reference to FIGS. 5(a) to 5(c). Similarly, a groove is formed in the substrate 1001, and a protective layer (see 1023 in FIG. 8) may also be formed in the groove. The protective layer 1023 and the previous protective layer 1021 surround the outer periphery of the ridge structure. In this way, similar processing conditions may be provided around the ridge structure, that is, the groove is formed in the substrate 1001, and the protective layers 1021, 1023 are formed in the groove.

Figure 8:
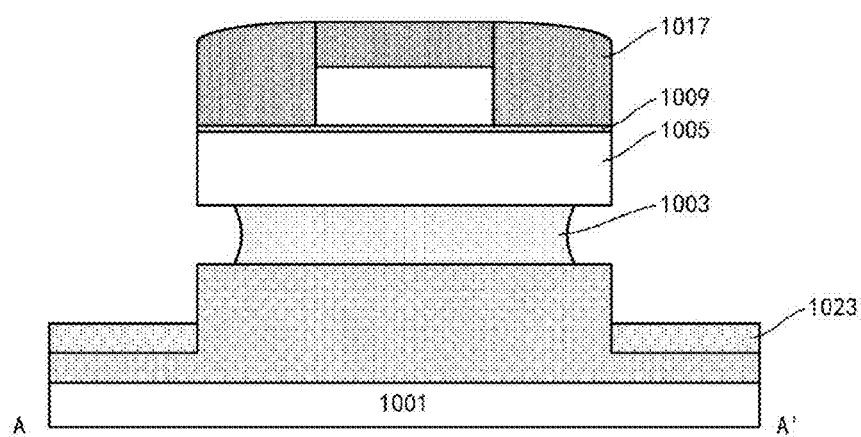

In order to form a gate stack surrounding the channel portion, a space for the gate stack may be left at two ends of the second material layer in the second direction (x direction). For example, as shown in FIG. 8, the second material layer 1003 may be selectively etched so that the sidewalls thereof in the second direction (x direction) is relatively recessed (the space for the gate stack may be defined). In order to better control an amount of etching, ALE may be used. For example, the amount of etching may be within a range of about 10 nm to 40 nm. As described above, after etching, the sidewalls of the second material layer 1003 may have an inwardly recessed C shape. The etching may be isotropic, especially when a larger etching amount is required. Generally, the C-shaped sidewalls of the second material layer 1003 have a larger curvature at the upper and lower ends, and a smaller curvature at the waist or the middle. The sidewalls may also be close to vertical.

Figure 9:
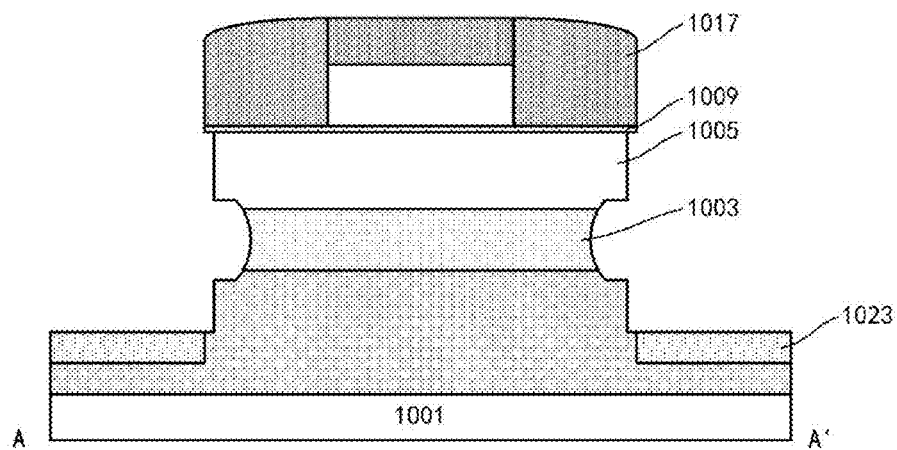

A first active layer may be formed on the sidewalls of the ridge structure so as to subsequently define the channel portion. In order to keep gate lengths (for example, in the direction perpendicular to the surface of the substrate) of gate stacks formed subsequently on the left and right sides of the C-shaped channel portion substantially equal, as shown in FIG. 9, the ridge structure (specifically, exposed surfaces of the first material layer, the second material layer, and the third material layer) may be etched back, so that outer peripheral sidewalls thereof may be recessed laterally with respect to outer peripheral sidewalls of the spacer 1017. In order to control a depth of the etching, ALE may be used. The etching depth may be substantially equal to a thickness of the first active layer to be subsequently grown, for example, ranging from about 5 nm to 15 nm.

Figure 10A:
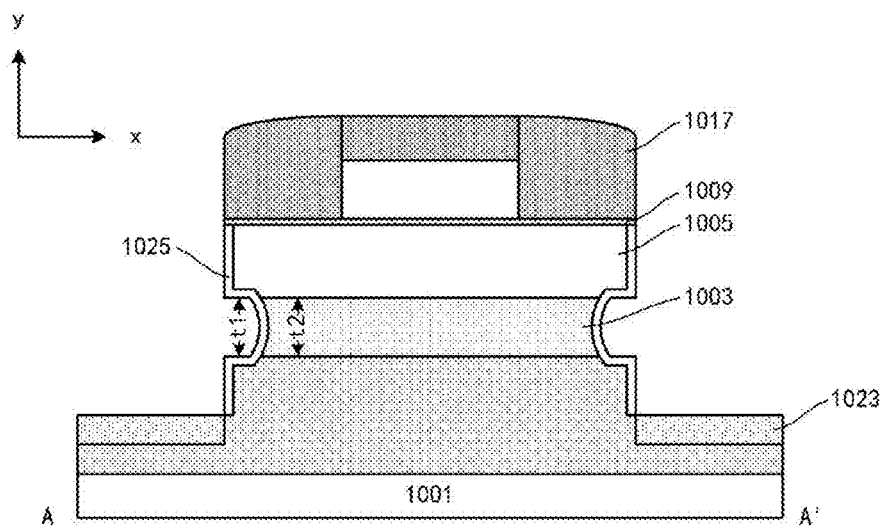

Then, as shown in FIG. 10(a), the first active layer 1025 may be formed on the sidewalls of the ridge structure by, for example, selective epitaxial growth. Due to the selective epitaxial growth, the first active layer 1025 may not be formed on a surface of the first position holding layer 1019. The first active layer 1025 may then define the channel portion, with a thickness ranging from, for example, about 3 nm to 15 nm. Since the channel portion (although it may be C-shaped) mainly extends in the vertical direction, the first active layer 1025 (especially a part thereof on the sidewalls of the second material layer) may also be referred to as a (vertical) channel layer. According to the embodiments of the present disclosure, the thickness of the first active layer 1025 (which is then used as the channel portion) may be determined by the epitaxial growth process, and thus the thickness of the channel portion may be better controlled. The first active layer 1025 may be doped in situ during the epitaxial growth to adjust a threshold voltage of the device.

In FIG. 10(a), sidewalls of parts of the first active layer 1025 on the sidewalls of the first material layer and the third material layer are shown to be substantially flush with the sidewalls of the spacer 1017. This may be achieved by controlling the amount of etching back and the thickness of the epitaxial growth to be substantially the same. However, the embodiments of the present disclosure are not limited to this. For example, the sidewalls of the parts of the first active layer 1025 on the sidewalls of the first material layer and the third material layer may be recessed with respect to the sidewalls of the spacer 1017, or may even be protruded.

By performing the above-mentioned etching back, the upper end and the lower end of the recessed portion may be etched upwards and downwards, respectively, so that after the first active layer 1025 is grown, a height t1 of the recessed portion and a thickness t2 of the second material layer 1003 may be substantially the same. In this way, the gate stacks subsequently formed on the left and right sides of the first active layer 1025 may have substantially equal gate lengths. However, the embodiments of the present disclosure are not limited to this. According to the embodiments of the present disclosure, the gate length outside the first active layer 1025 may also be changed by adjusting the amount of etching back, thereby changing a ratio of the gate lengths on two sides to optimize a influence of differences in morphology on the left and right sides of the C-shaped channel portion on device performance.

The first active layer 1025 may include various semiconductor materials, such as Si, Ge, SiGe, InP, GaAs, InGaAs, and the like. The material of the first active layer 1025 may be appropriately selected according to performance requirements of the design on the device. In order to generate stress in the channel portion to enhance device performance, a lattice constant of the material of the first active layer 1025 without being strained may be different from a lattice constant of the material of the second material layer 1003 without being strained. For example, if the lattice constant of the material of the second material layer 1003 without being strained is greater than the lattice constant of the material of the first active layer 1025 without being strained, the first active layer 1025 may have a tensile stress (for example, for n-type devices); and if the lattice constant of the material of the second material layer 1003 without being strained is less than the lattice constant of the material of the first active layer 1025 without being strained, the first active layer 1025 may have a compressive stress (for example, for p-type devices).

For example, the first active layer 1025 may include the same material as that of the first material layer and the third material layer, such as Si. In this case, since the second material layer 1003 (in this example, including SiGe) is relaxed in the y direction as described above, the first active layer 1025 may have a tensile stress substantially in the second direction.

In the example of FIG. 10(*a*), the first active layers 1025 on the opposite sides of the ridge structure in the second direction (x direction) may have substantially same features (for example, material, dimension, doping characteristics, etc.), and may be symmetrically arranged on opposite sides of the second material layer. However, the embodiments of the present disclosure are not limited to this. As will be described below, with a single ridge structure, two devices opposite to each other may be formed. According to performance requirements of the two devices, the first active layers 1025 on the opposite sides of the ridge structure may have different features, for example, different in at least one of thickness, material, or doping characteristics. This may be achieved by shielding another device region when the first active layer is grown in one device region.

In the above example (the second material layer 1003 including SiGe and the first active layer 1025 including Si), a tensile stress may be achieved in the channel portion. According to the embodiments of the present disclosure, different materials or material combinations may also be used to achieve different types and/or different levels of stress.

In an example, as shown in FIG. 10(*b*), an etching stop layer 1025*a* and a first active layer 1025*b* may be sequentially formed on the sidewalls of the ridge structure by, for example, selective epitaxial growth. The etching stop layer 1025*a* may define a etching stop position when the second material layer 1003 is subsequently etched (this is because in this example, both the first active layer 1025*b* and the second material layer 1003 include SiGe, if the etching stop layer is not provided, the first active layer 1025*b* may be affected when the second material layer 1003 is etched), with a thickness ranging from, for example, about 1 nm to 5 nm. The first active layer 1025*b* may subsequently define the channel portion as described above, with a thickness ranging from, for example, about 3 nm to 15 nm. In this example, the etching stop layer 1025*a* may include Si, and the first active layer 1025*b* may include SiGe. In order to achieve a compressive stress, an atomic percentage of Ge in the first active layer 1025*b* may be greater than an atomic percentage of Ge in the second material layer 1003.

Other different semiconductor materials, such as III-V compound semiconductor material, may be grown to achieve a desired strain or stress.

Hereinafter, for convenience, the case shown in FIG. 10(*a*) is still used as an example for description.

Figure 11:
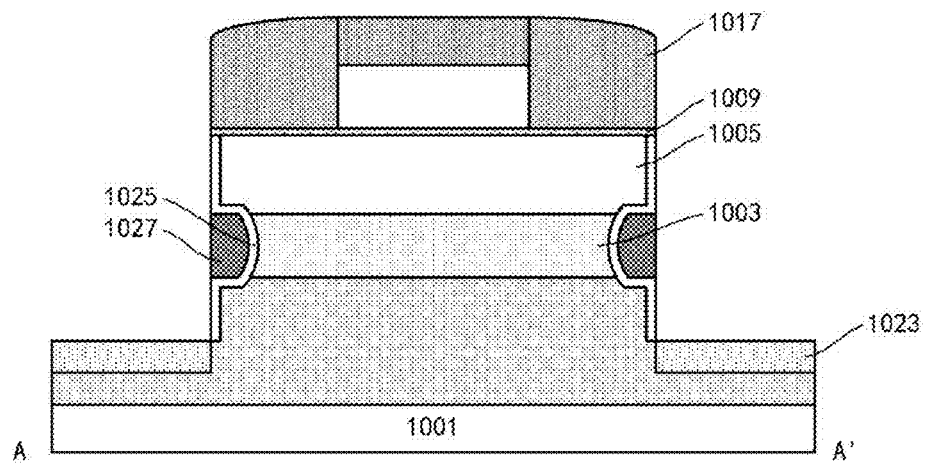

Since the second material layer 1003 is recessed, a gap is formed on the outside of a part of the first active layer 1025 corresponding to the second material layer 1003. In this gap, a gate stack may then be formed. In order to prevent subsequent processing from leaving unnecessary materials in the gap or affecting the first active layer 1025, as shown in FIG. 11, a second position holding layer 1027 may be formed in the gap. Similarly, the second position holding layer 1027 may be formed by deposition and then etching back, and may include a dielectric material such as SiC. In this example, the first position holding layer 1019 and the second position holding layer 1027 include a same material, so that they may be removed together with a same etching recipe later. However, the embodiments of the present disclosure are not limited to this, for example, the first position holding layer 1019 and the second position holding layer 1027 may include different materials.

After that, source/drain doping may be performed.

Figure 12:
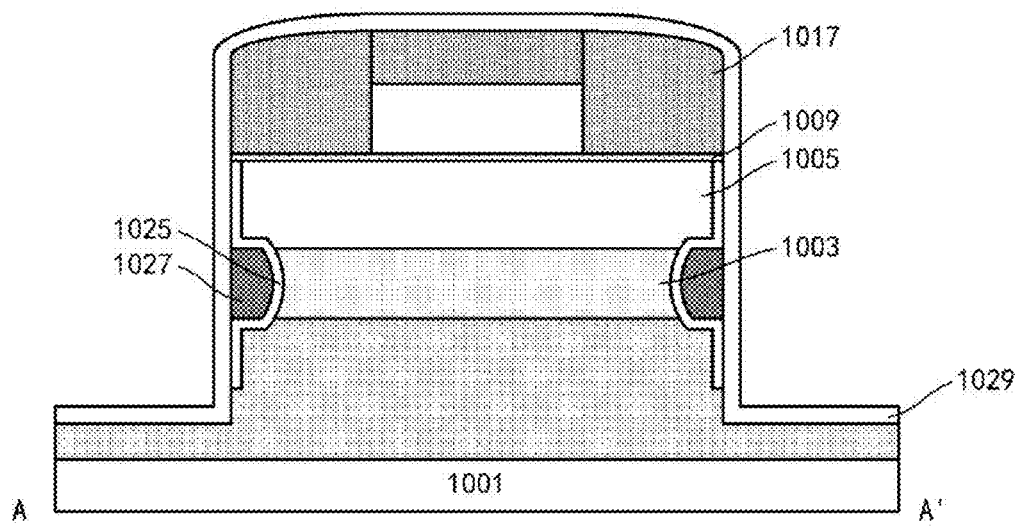

As shown in FIG. 12, a solid phase dopant source layer 1029 may be formed on the structure shown in FIG. 11 by, for example, deposition. The solid phase dopant source layer 1029 may be formed in a substantially conformal manner. For example, the solid phase dopant source layer 1029 may be an oxide containing a dopant, with a thickness ranging from about 1 nm to 5 nm. The dopant contained in the solid phase dopant source layer 1029 may be used to dope the source/drain portions (and optionally, the exposed surface of the substrate 1001), and the solid phase dopant source layer 1029 may have a same conductivity type with the source/drain portions to be formed. For example, for p-type devices, the solid phase dopant source layer 1029 may contain a p-type dopant such as B or In; for n-type devices, the solid phase dopant source layer 1029 may contain an n-type dopant such as P or As. A concentration of the dopant of the solid phase dopant source layer 1029 may be within a range of about 0.1% to 5%.

In this example, before the solid phase dopant source layer 1029 is formed, the protective layers 1021, 1023 may be selectively etched by, for example, RIE, to expose the surface of the substrate 1001. In this way, the exposed surface of the substrate 1001 may also be doped to form respective contact regions of the lower end of the source/drain portions S/D of the two devices.

Figure 13:
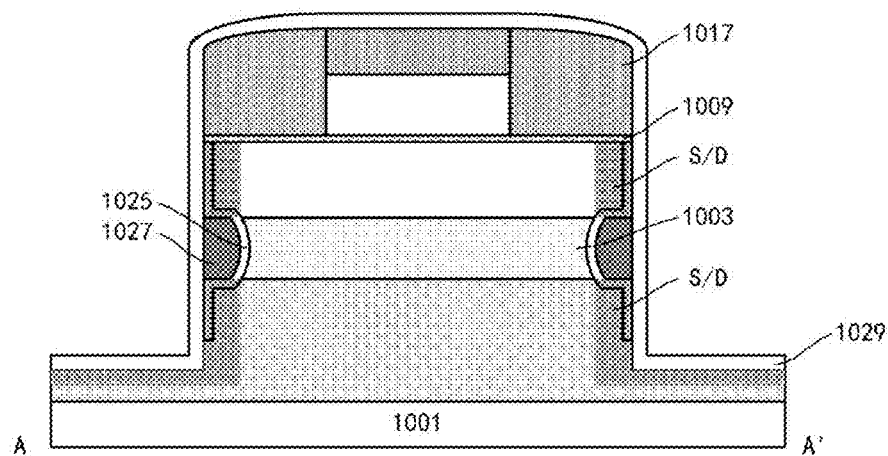

The dopant in the solid phase dopant source layer 1029 may be driven into the first material layer and the third material layer to form the source/drain portions S/D (and optionally, may be driven into the exposed surface of the substrate 1001 to form the respective contact regions of the lower source/drain portions S/D of the two devices), as shown in FIG. 13. After that, the solid phase dopant source layer 1029 may be removed.

Since the first material layer and the third material layer may have the same material, and the solid phase dopant source layer 1029 may be formed on their surfaces in a substantially conformal manner, a driving degree of the dopant from the solid phase dopant source layer 1029 into the first material layer and the third material layer may be substantially the same. Therefore, (doping concentration) interfaces between the source/drain portions S/D (and an inner part of the first material layer and an inner part of the third material layer) may be substantially parallel to the surfaces of the first material layer and the third material layer, and that is, they may be in the vertical direction and may be aligned with each other.

In this example, the first material layer is provided by the upper part of the substrate 1001. However, the embodiments of the present disclosure are not limited to this. For example, the first material layer may also be an epitaxial layer on the substrate 1001. In this case, the first material layer and the third material layer may be doped in-situ during epitaxial growth, instead of using the solid phase dopant source layer for doping.

Figure 14A:
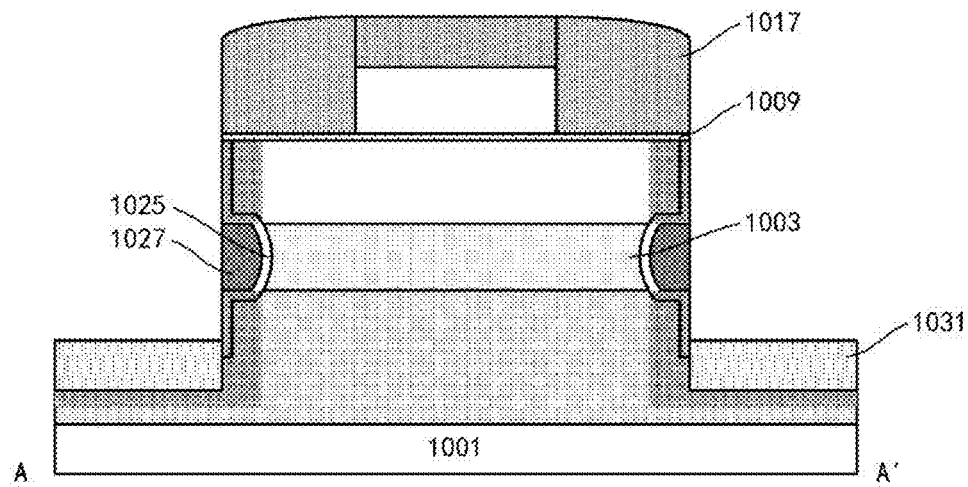
Figure 14B:
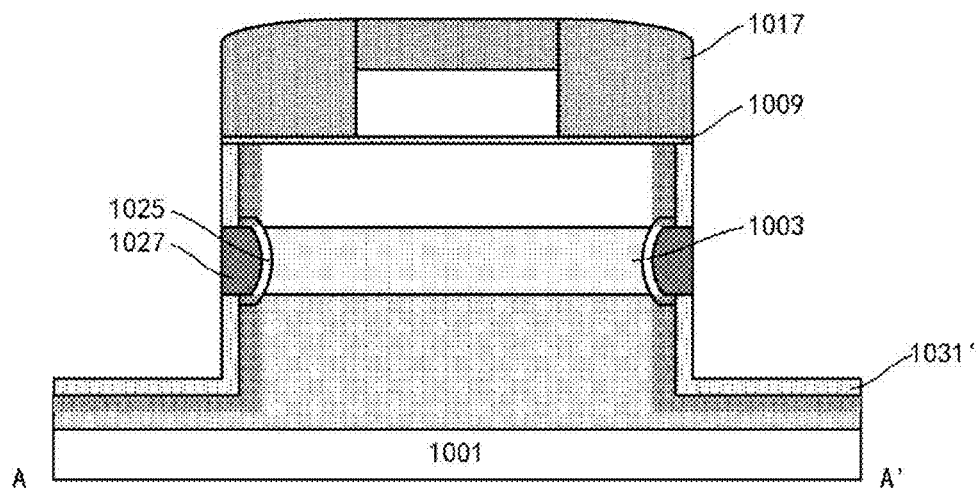

In the groove around the ridge structure, an isolation layer 1031 such as shallow trench isolation (STI) may be formed, as shown in FIG. 14(*a*). The method of forming the isolation layer may be similar to the method of forming the protective layers 1021 and 1023 as described above, and will not be repeated here.

In order to reduce a capacitance between the gate and the source/drain, an overlap between the gate and the source/drain portions may be further reduced. For example, as shown in FIG. 14(*b*), after the solid phase dopant source layer 1029 is removed, the exposed surfaces of the first material layer and the third material layer may be further recessed by selective etching, so that the overlaps between the source/drain portions S/D formed in the first material layer and the third material layer and the first position holding layer 1019 and the second position holding layer 1027 (which subsequently defines the position of the gate stack) are reduced. In the gaps formed under the hard mask layer 1013 and the spacer 1017 due to the recessed surfaces of the first material layer and the third material layer, a dielectric 1031' such as oxynitride or oxide may be filled. The Filling may be achieved by deposition (and planarization) and then etching back. During the etching back, a certain thickness of the dielectric 1031' is left on the surface of the substrate 1001 to form an isolation portion.

Hereinafter, for convenience, the case shown in FIG. 14(*a*) is still taken as an example for description.

The first position holding layer 1019 and the second position holding layer 1027 (on an outer side) and the second material layer 1003 (on an inner side) surround a part of the first active layer 1025. This part of the first active layer 1025 may serve as the channel portion. It can be seen that the channel portion is a C-shaped curved nanosheet (when the nanosheet is narrow, for example, a dimension in the direction perpendicular to the paper plane of FIG. 14(*a*), that is, the z direction is small, it may become a nanowire). Due to high etching selectivity of the second material layer 1003 (SiGe) relative to the first active layer 1025 (Si) when etching the second material layer 1003 (SiGe), the thickness (in a case of the nanowire, a boldness or a diameter) of the channel portion is substantially determined by the selective growth process of the first active layer 1025. This has a huge advantage over the technology that only uses an etching method or a photolithography method to determine the thickness, because the epitaxial growth process has much better process control than the etching or photolithography. Therefore, the control of the stress is also better.

In order to maintain the stress of the channel portion, when forming the gate stack, two sides of the channel portion may be processed separately. For example, when one side is processed, the other side may be held by another material layer (so this material layer may be referred as a supporting layer) to prevent the stress release.

In the structure shown in FIG. 14(*a*), the outer side of the channel portion may be processed first, because the outer side of the channel portion may be exposed by removing the first position holding layer 1019 and the second position holding layer 1027. The embodiments of the present disclosure are not limited to this, for example, a sequence of the processing on the outer side and the processing on the inner side described below may be exchanged, as long as one side is processed while the other side is held.

Figure 15A:
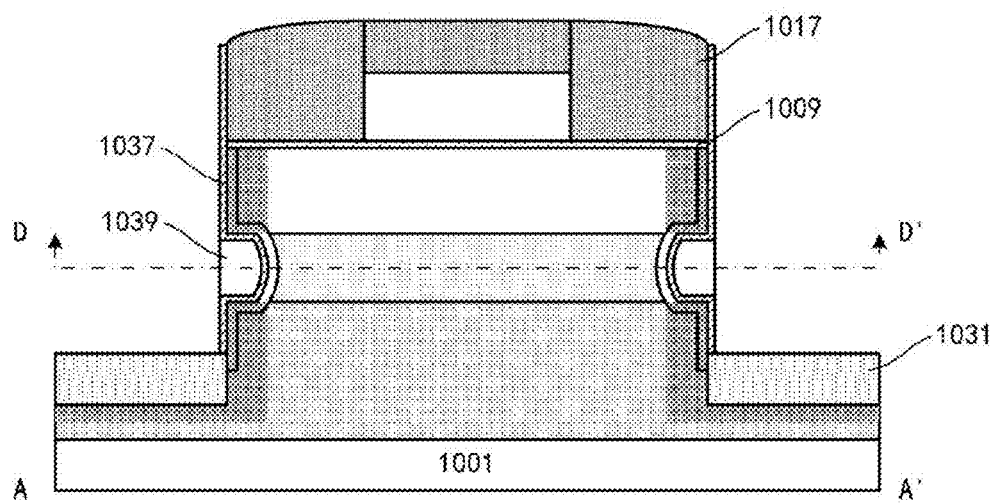
Figure 15B:
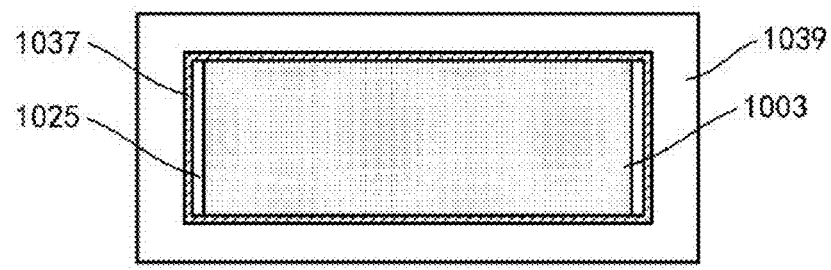
FIGS. 15(b), 18(c), 19(b), 23(c), 24(b) are cross-sectional views taken along line DD' in corresponding cross-sectional views.

For example, as shown in FIGS. 15(*a*) and 15(*b*), the first position holding layer 1019 and the second position holding layer 1027 (in this example, both including SiC) may be removed by selective etching. Thus, a part of the first active layer 1025 may be exposed, and a gate stack may be formed on this part. For example, a gate dielectric layer 1037 may be formed by deposition in a substantially conformal manner, and a gate conductor layer 1039 may be formed on the gate dielectric layer 1037. By depositing and then etching back, the gate conductor layer 1039 may substantially occupy a space where the first position holding layer 1019 and the second position holding layer 1027 were previously located. The gate dielectric layer 1037 may also be anisotropically etched, such as RIE along the vertical direction, to expose the hard mask layer 1013 for subsequent processing.

For example, the gate dielectric layer 1037 may include a high-k gate dielectric such as $HfO_2$, with a thickness ranging from, for example, about 2 nm to 10 nm. Before forming the high-k gate dielectric, an interface layer may also be formed, for example, an oxide formed by an oxidation process or deposition such as atomic layer deposition (ALD), with a thickness ranging from about 0.3 nm to 1.5 nm. The gate conductor layer 1039 may include a work function adjusting metal such as TiN, TaN, TiAlC, etc. and a gate conductive metal such as W, etc.

When removing the first position holding layer 1019 and the second position holding layer 1027, the first active layer 1025 is held on the inner side by the second material layer 1003, so that the stress therein may be suppressed from being released.

Next, the inner side of the channel portion may be processed. As shown in FIG. 15(*b*), when processing the inner side of the channel portion, the first active layer 1025 is surrounded by the gate dielectric layer 1037 and the gate conductor layer 1039 on the outer side, so that the stress therein may be suppressed from being released.

Figure 16:
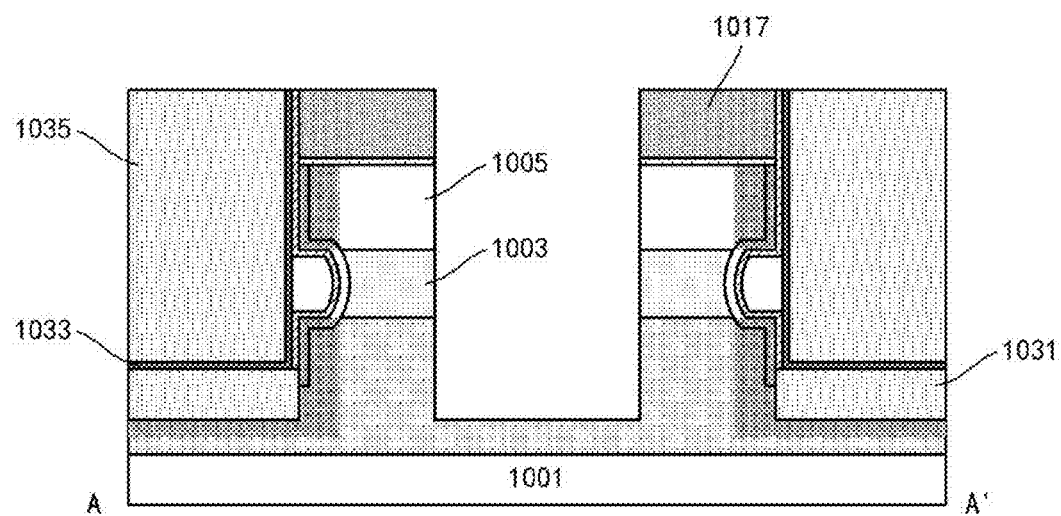

In order to provide an etching stop layer and avoid affecting the gate stack already formed on the outer side (thus affecting its stress holding effect) when processing the inner side, as shown in FIG. 16, an etching stop layer or a protective layer 1033 may be formed on the isolation layer 1031. The etching stop layer or the protective layer 1033 may be formed in a substantially conformal manner, and may include a material with a desired etch selectivity (for example, relative to the gate stack, the isolation layer, the first to the third material layers, etc., which may be clear according to subsequent selective etching operations), such as SiC.

A dielectric material 1035 such as oxide may be formed on the etching stop layer or the protective layer 1033 by deposition. The dielectric material 1035 is conductive to open a processing channel to the inner side. For example, a planarization process such as CMP may be performed to remove the hard mask layer 1013 to expose the mandrel 1011. During the planarization process, a height of the spacer 1017 may be reduced. Then, the mandrel 1011 may be removed by selective etching such as wet etching using TMAH solution or dry etching using RIE. In this way, a pair of spacers 1017 extending opposite to each other are left on the ridge structure (with the height being reduced, and the top morphology may also be changed).

The spacer 1017 and the dielectric material 1035 may be used as an etching mask, and the etching stop layer 1009, the third material layer 1005, the second material layer 1003, and the upper part of the substrate 1001 may be selectively etched in sequence by, for example, RIE. The etching can be performed into the well region of the substrate 1001. In this way, in the space surrounded by the isolation layer 1031, the third material layer 1005, the second material layer 1003 and the upper part of the substrate 1001 form a pair of stacks corresponding to the spacers 1017 to define the active region.

The formation of the stack used to define the active region is not limited to the spacer pattern transfer technology, and may also be performed by photolithography using photoresist or the like.

Figure 17:
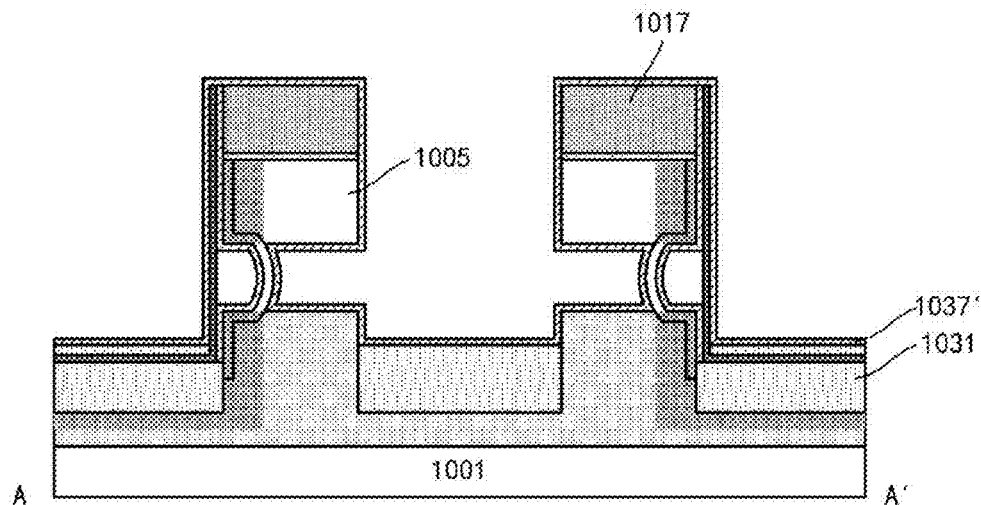

Then, as shown in FIG. 17, with respect to the first active layer 1025, the substrate 1001, and the third material layer 1005 (in this example, all including Si), the second material layer 1003 (including SiGe in this example) may be removed by selective etching. Thus, the inner side of the channel portion is exposed, and the outer side of the channel portion is held by the gate stack, so that the stress in the channel portion may be suppressed from being released.

Figure 10B:
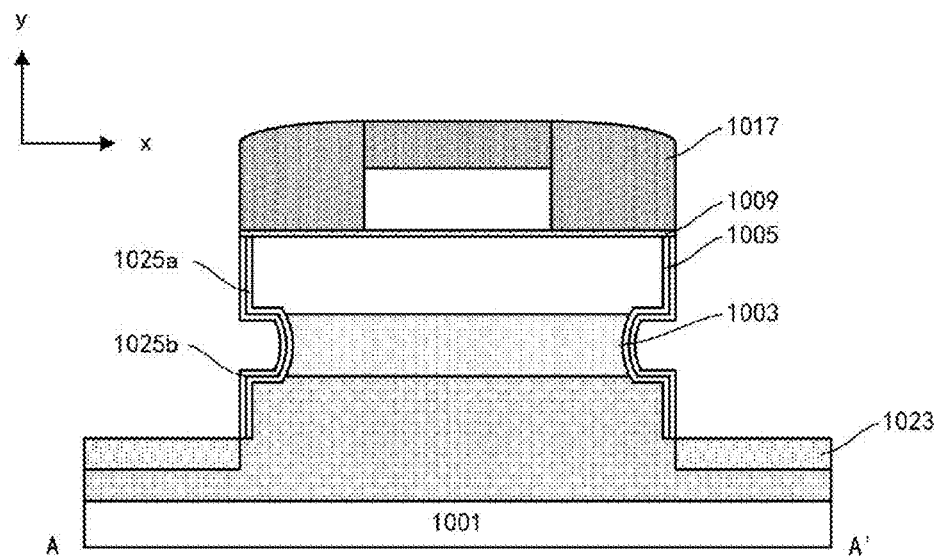

In the case shown in FIG. 10(b), the selective etching of the second material layer 1003 may stop at the etching stop layer 1025a, and the etching stop layer 1025a may be further removed to expose the first active layer 1025b. Alternatively, the etching stop layer 1025a may also be retained, because the etching stop layer 1025a including Si is conductive to improve the characteristics of the gate-dielectric interface.

Similarly, a gate stack may be formed on the inner side.

Before forming the gate stack, an isolation layer may be formed on the inner side. For example, as shown in FIG. 17, an isolation layer may be formed on the inner side by deposition (and planarization) and then etching back. For example, the isolation layer may include an oxide, and therefore is shown as 1031 together with the previous isolation layer 1031 and the dielectric material 1035 (also etched back together). A top surface of the isolation layer 1031 may be lower than a top surface of the first material layer (i.e., the top surface of the substrate 1001) or a bottom surface of the second material layer. The gate dielectric layer 1037' may be formed by deposition in a substantially conformal manner. In order to keep the device performance consistent, the gate dielectric layer 1037' may have substantially the same performance parameters (material, thickness, etc.) as that of the gate dielectric layer 1037. The gate dielectric layer 1037' may overlap with a part of the gate dielectric layer 1037 (see FIG. 18(c)).

Figure 18A:
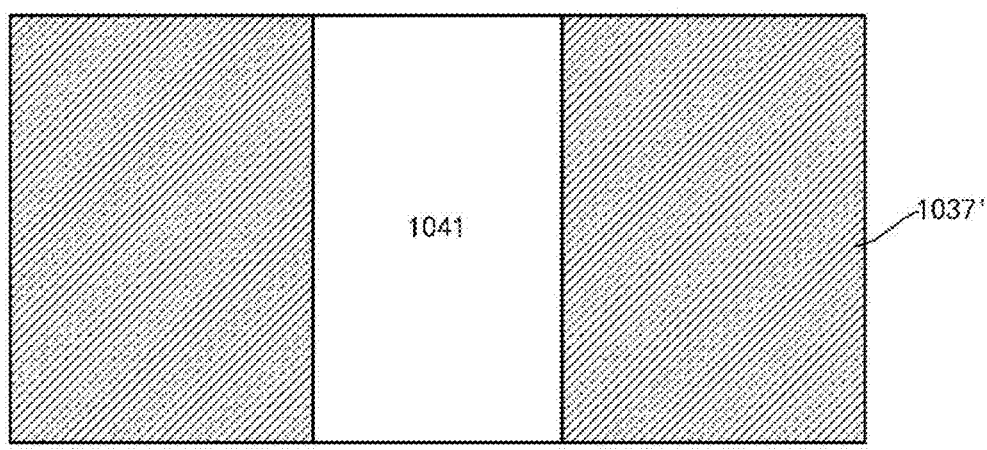
Figure 18B:
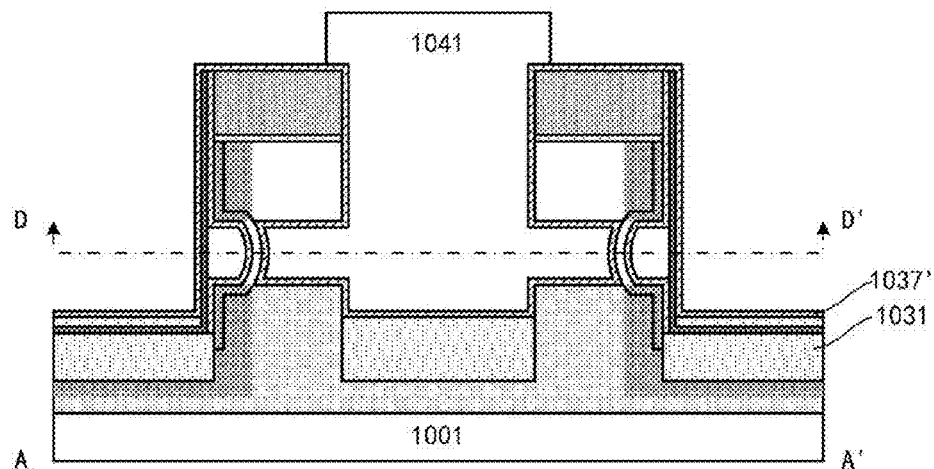
Figure 18C:
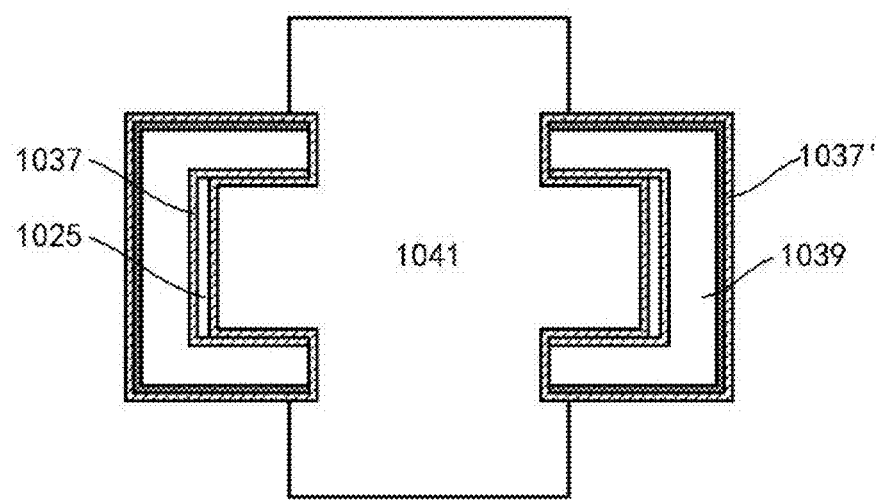

The gate conductor layer 1039 formed on the outer side is surrounded by the protective layer 1033 and the gate dielectric layer 1037' (see FIG. 18(c)). In order to enable the gate conductor layers on the inner side and the outer side of the channel portion to be connected to each other (to be integrated so as to apply a uniform gate voltage), or even if the gate conductor layers on the two sides are not integrated, in order to subsequently form an electrical connection to the gate conductor layer 1039, at least a part of the sidewall of the gate conductor layer 1039 may be exposed.

Figure 19A:
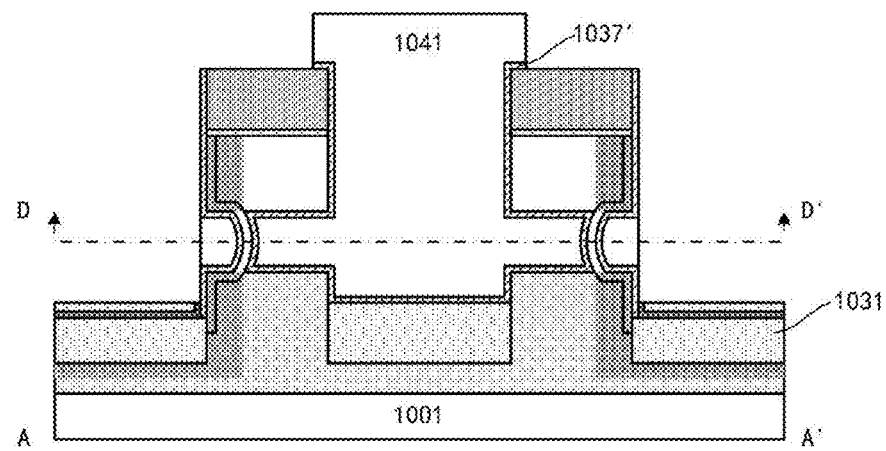
Figure 19B:
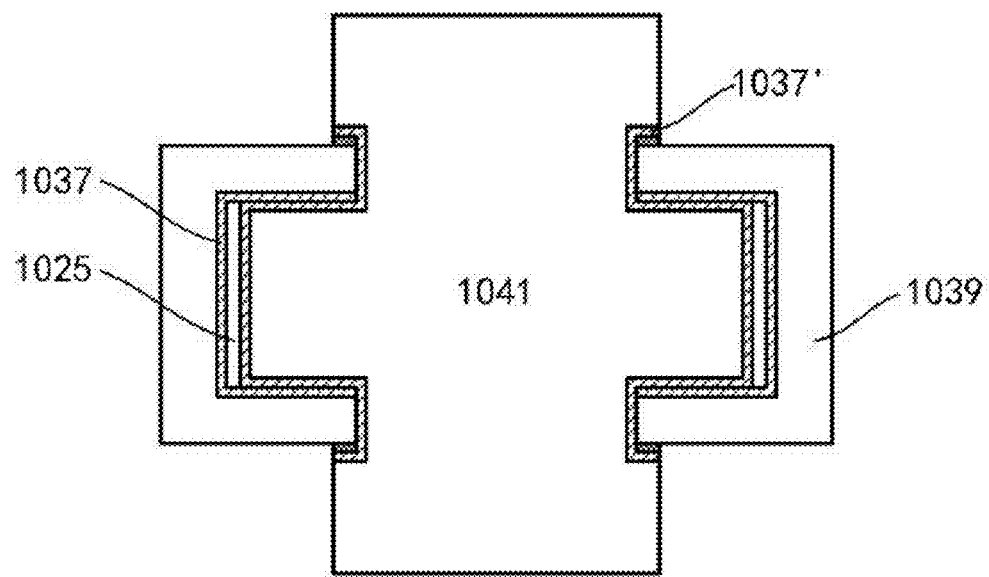

As shown in FIGS. 18(a) to 18(c), a mask layer such as a photoresist 1041 may be formed to at least partially expose a part of the gate dielectric layer 1037' extending on the sidewall of the gate conductor layer 1039. Then, as shown in FIGS. 19(a) and 19(b), the photoresist 1041 may be used as an etching mask, and the exposed gate dielectric layer 1037' and the protective layer 1033 are removed by selective etching such as RIE. Thus, at least part of the sidewall of the gate conductor layer 1039 is exposed. After that, the photoresist 1041 may be removed.

Although part of the gate dielectric layer 1037' is removed, the part of the first active layer 1025 used as the channel portion is still surrounded by the gate dielectric layer (the gate dielectric layer 1037 on the outer side and the gate dielectric layer 1037' on the inner side, and the two gate dielectric layers partially overlap).

Figure 20:
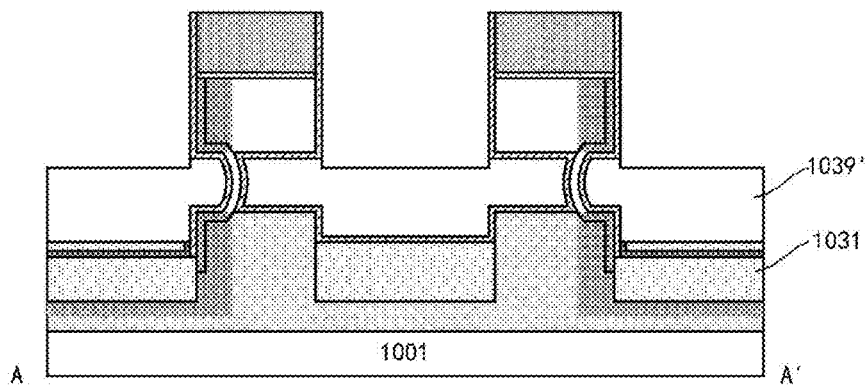

As shown in FIG. 20, a gate conductor layer 1039' may be formed by deposition. The gate conductor layer 1039' may be planarized, such as CMP, and the CMP may stop at the spacer 1017. Then, the gate conductor layer 1039' may be etched back so that its top surface is lower than the top surfaces of the previous first position holding layer 1019 and the second position holding layer 1027 (or a top surface of the second material layer or a bottom surface of the third material layer), so as to reduce the capacitance between the source/drain portions and the gate stack. In this way, an end portion of the formed gate stack is embedded in the space where the first position holding layer 1019, the second position holding layer 1027, and the second material layer 1003 were previously located, and surrounds the channel portion. In order to keep the device performance consistent, the gate conductor layer 1039' may have substantially the same performance parameters (materials, etc.) as that of the gate conductor layer 1039, and since the gate conductor layer 1039 has an exposed sidewall, so that the gate conductor layer 1039' and the gate conductor layer 1039 may be connected as a whole which is shown as 1039''.

The respective gate stacks of the two devices are connected to each other as a whole. According to a device design, the gate conductor layer 1039' may be disconnected between the two devices by, for example, photolithography, and a landing pad of a gate contact portion may also be patterned.

Figure 21A:
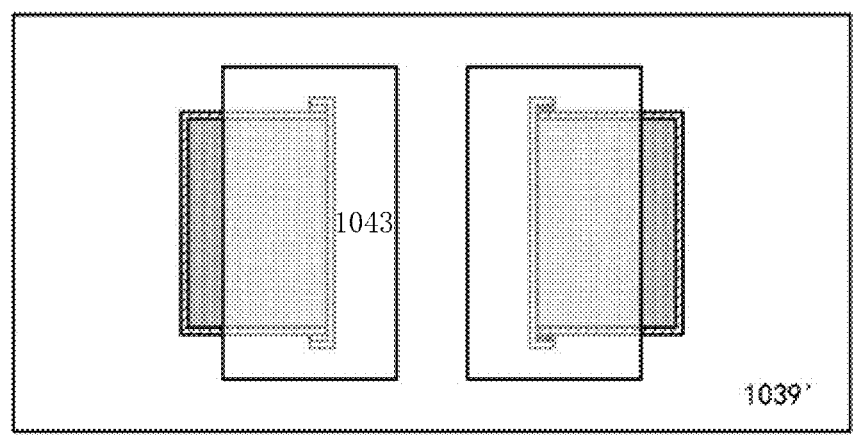
Figure 21B:
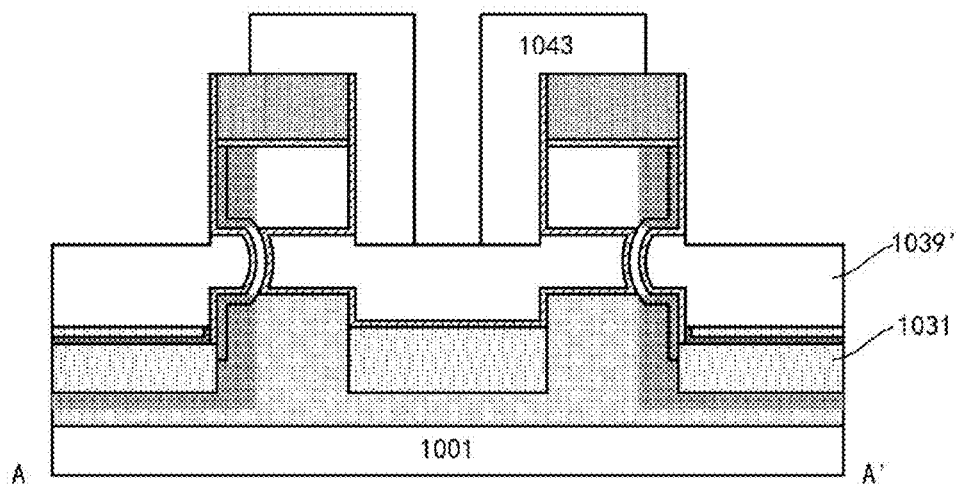

As shown in FIGS. 21(a) and 21(b), a photoresist 1043 may be formed and patterned to shield an area where the landing pad of the gate contact portion is to be formed, while other areas are exposed. As shown in FIG. 21(a), the photoresist 1043 may cover corners of the inner side, so that the gate conductor layers on the inner side and the outer side of the channel portion may remain integrated.

Figure 22A:
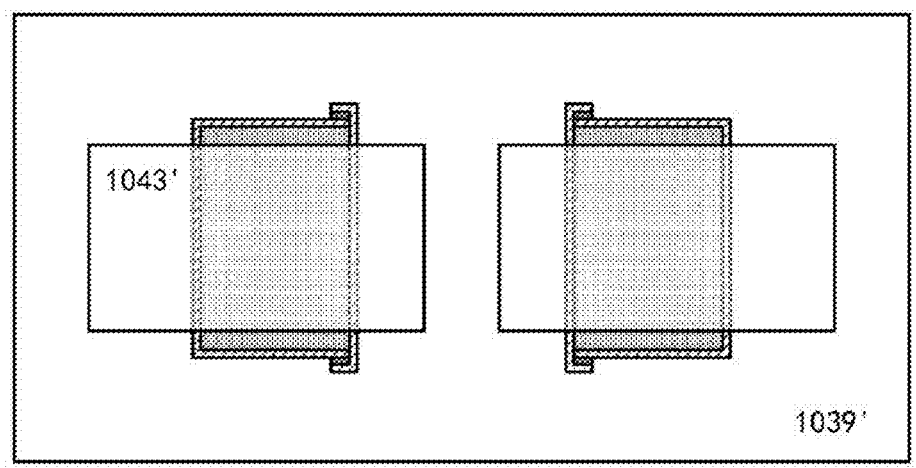
Figure 22B:
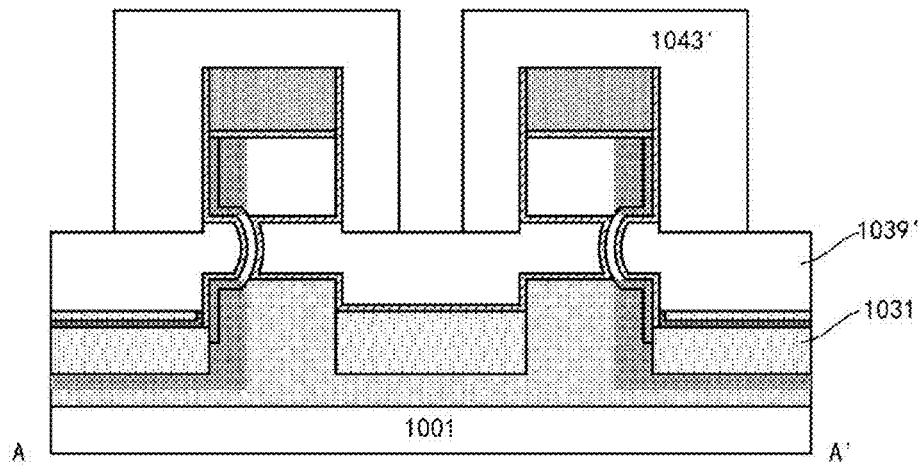

Alternatively, as shown in FIGS. 22(a) and 22(b), a photoresist 1043' may be formed and patterned to shield the area where the landing pad of the gate contact portion is to be formed, while other areas are exposed. As shown in FIG. 22(a), the photoresist 1043' may expose corners of the inner side, so that the gate conductor layers on the inner side and the outer side of the channel portion may be separated.

Figure 23A:
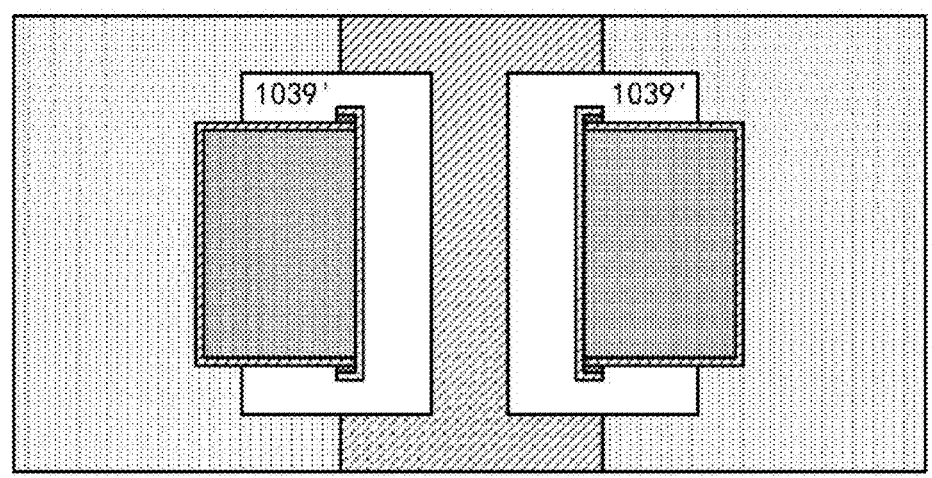
Figure 23B:
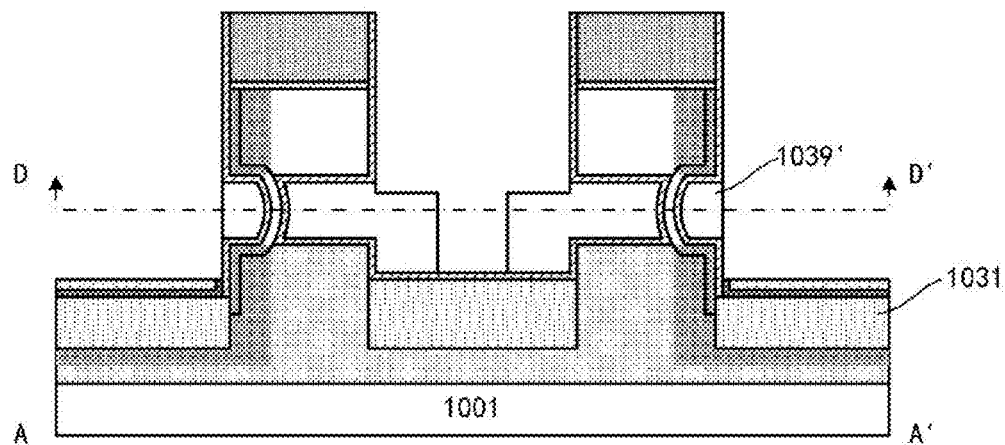
Figure 23C:
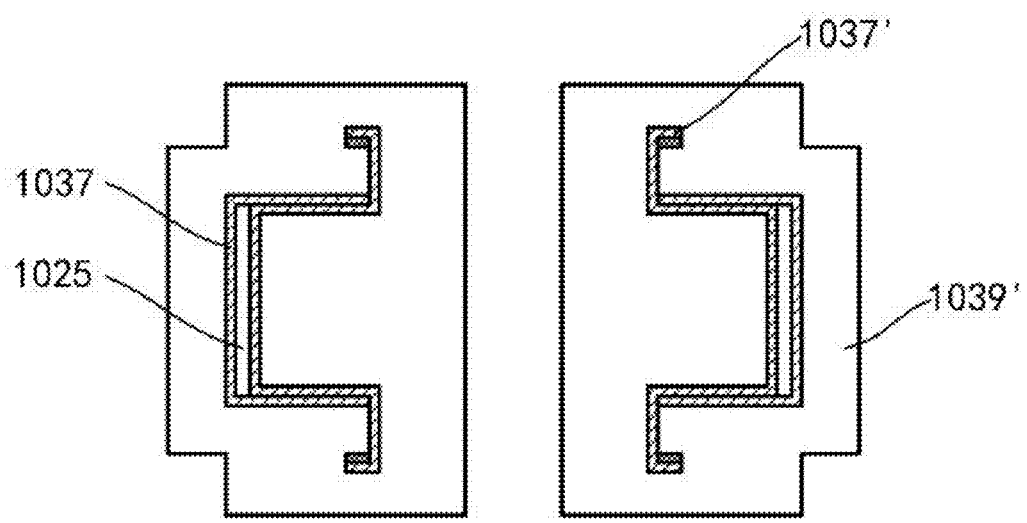

As shown in FIGS. 23(a) to 23(c), the photoresist 1043 (and the spacer 1017) may be used as a mask to selectively etch, such as RIE, the gate conductor layer 1039'. After that, the photoresist 1043 may be removed.

Thus, the gate conductor layer 1039' is substantially left and self-aligned under the spacer 1017, except for a part of the gate conductor layer 1039' protruding from one side (the inner side in the drawing) of the spacer 1017 to serve as a landing pad. The gate conductor layer 1039' is separated between the two opposing devices respectively located under the opposing spacers 1017, so as to combine with the gate dielectric layers 1037, 1037' to define the gate stacks for the two devices, respectively. As shown in FIG. 23(c), the gate conductor layer 1039' surrounds the channel portion, and the gate dielectric layers 1037 and 1037' are sandwiched between the gate conductor layer and the channel portion.

In this example, the respective landing pads of the two devices are located between opposing spacers 1017. However, the embodiments of the present disclosure are not limited to this. For example, the respective landing pads of the two devices may be located at different positions.

Figure 24A:
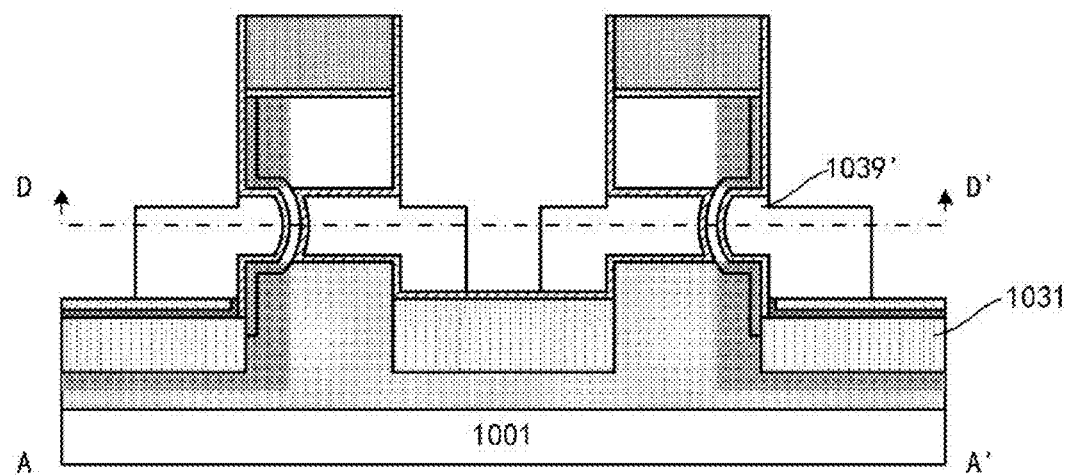
Figure 24B:
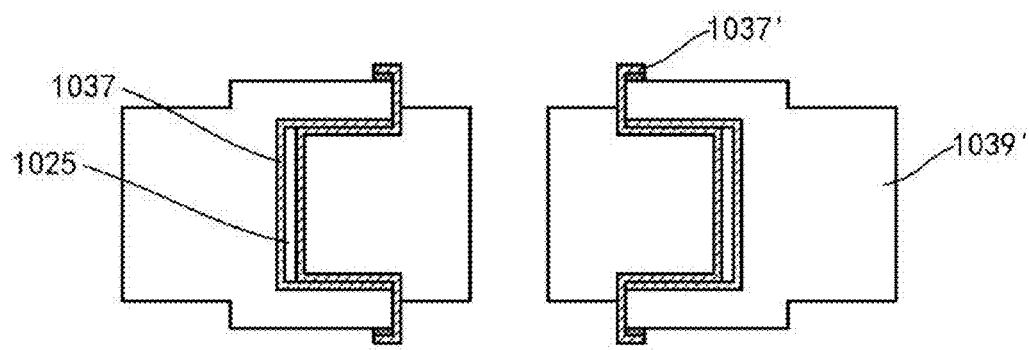

Alternatively, as shown in FIGS. 24(a) and 24(b), the photoresist 1043' (and the spacer 1017) may be used as a mask to selectively etch, such as RIE, the gate conductor layer 1039'. After that, the photoresist 1043' can be removed.

In this example, the gate conductor layer 1039' is separated on the inner side and the outer side of the channel portion, and therefore has protruding portions on the inner side and the outer side, respectively, so as to be used as the landing pads.

The fabrication of the basic structure of the device is completed. Subsequently, various contact portions, interconnection structures, etc. may be manufactured.

Figure 25A:
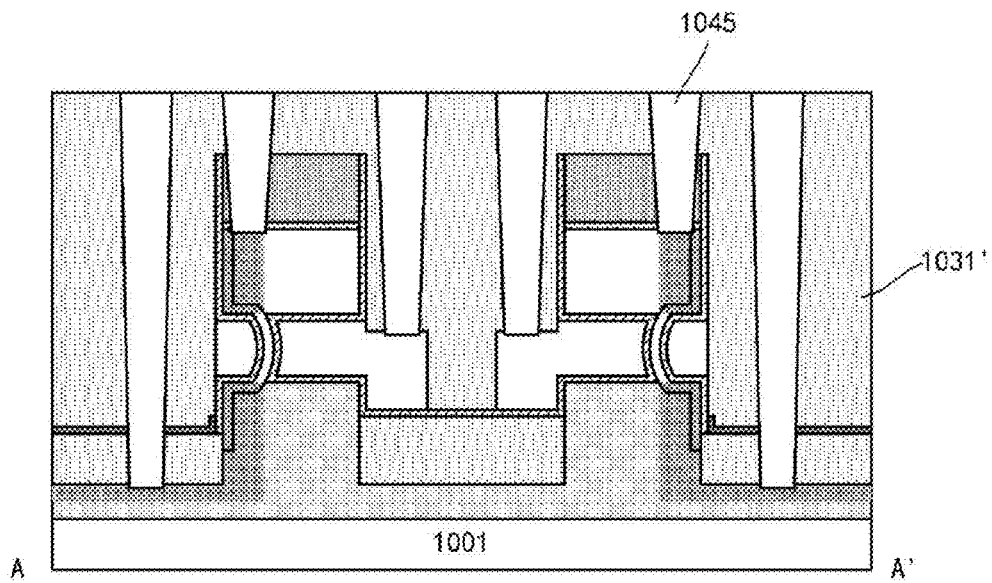

For example, as shown in FIG. 25(a), a dielectric layer (shown as 1031' integrally with the previously formed isolation layer 1031) may be formed on the substrate by, for example, deposition and then planarization. Then, a contact hole may be formed, and a conductive material such as metal may be filled in the contact hole to form a contact portion 1045. The contact portion 1045 may include a contact portion penetrating the spacer 1017 and the etching stop layer 1009 and connected to an upper end of the source/drain portions, a contact portion penetrating the dielectric layer 1031' and connected to the contact region of a lower end of the source/drain portions, and a contact portion penetrating the dielectric layer 1031' and connected to the landing pad of the gate conductor layer.

Figure 25B:
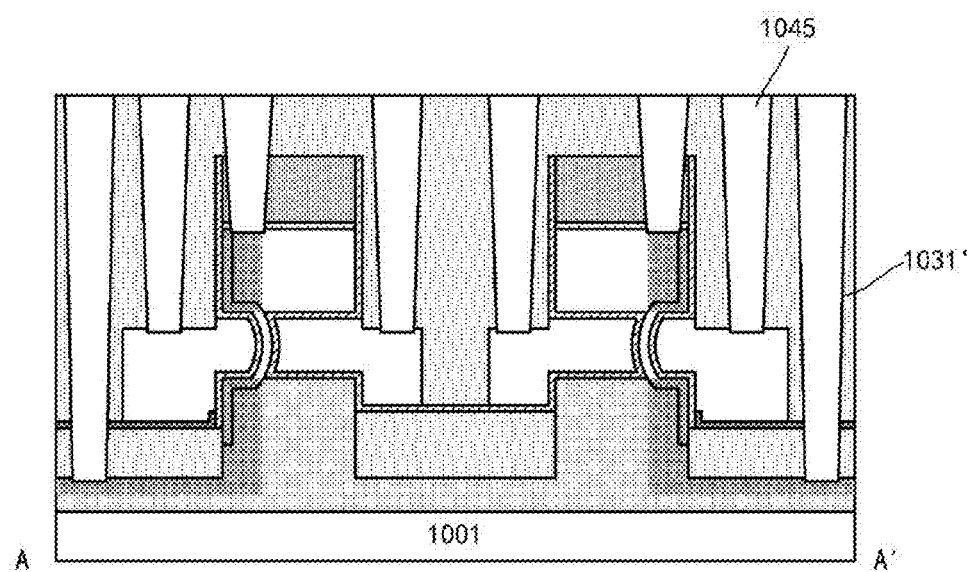

FIG. 25(b) shows a case that the gate conductor layers on the inner side and the outer side of the channel portion are separated, and contact portions are formed for the separated gate conductor layers.

In the above embodiment, by removing the first position holding layer 1019 and the second position holding layer 1027, the gate stack (1037/1039) is formed outside the channel portion, and then a gate stack (1037'/1039') is formed on the inner side of the channel portion by removing the second material layer. However, the embodiments of the present disclosure are not limited to this. For example, if the first position holding layer 1019 and the second position holding layer 1027 are retained, the second material layer may be replaced with a third position holding layer. The method of forming the third position holding layer may be similar to the method of forming the first position holding layer 1019 and the second position holding layer 1027, such as depositing and etching back a dielectric material. The third position holding layer may have an etching selectivity with respect to the first position holding layer 1019 and the second position holding layer 1027 so as to be replaced with gate stacks, respectively. In this way, the first position holding layer 1019, the second position holding layer 1027, and the third position holding layer may form a sacrificial gate surrounding the channel portion. Based on the sacrificial gate, the source/drain regions may be easily processed, such as etching, epitaxy, silicidation, etc. After that, the first position holding layer 1019, the second position holding layer 1027 and the third position holding layer may be replaced with the gate stacks, respectively.

In the above embodiment, two devices are formed based on a single ridge structure. This helps simplify manufacturing. However, the embodiments of the present disclosure are not limited to this. For example, a single device may be formed based on a single ridge structure. In this case, the single ridge structure may be similar to a stack under the single spacer 1017 described above, and the processing of the single ridge structure is similar to the processing of the stack, a difference is that when processing the outer side of the channel portion, the sidewall of the single ridge structure on a side of the hard mask layer 1013 or the mandrel may be shielded by another material layer.

According to the embodiments of the present disclosure, two sides of the channel portion are respectively processed. Thus, the channel portion may always be held by other layers, so that the stress or strain in the channel portion may be suppressed from being released, therefore the stress or strain in the channel portion may be enhanced to improve device performance.

The semiconductor device according to the embodiments of the present disclosure may be applied to various electronic apparatuses. For example, it is possible to form an integrated circuit (IC) based on such a semiconductor device, and thereby construct an electronic apparatus. Therefore, the present disclosure also provides an electronic apparatus including the above-mentioned semiconductor device. The electronic apparatus may also include components such as a display screen matched with the integrated circuit and a wireless transceiver matched with the integrated circuit. Such electronic apparatus may be, for example, a smart phone, a computer, a tablet computer (PC), a wearable smart device, a mobile power supply, and so on.

According to the embodiments of the present disclosure, a method of manufacturing a system on chip (SoC) is also provided. The method may include the methods described above. Specifically, a variety of devices may be integrated on a chip, at least some of which are manufactured according to the methods of the present disclosure.

In the above description, the technical details such as patterning and etching of each layer are not explained in detail. However, those skilled in the art should understand that various technical means may be used to form the layers, the regions, etc. of desired shapes. In addition, in order to form the same structure, those skilled in the art may also design a method that is not completely the same as the methods described above. In addition, although each embodiment has been described above, this does not mean that the measures in the respective embodiments cannot be advantageously used in combination.

The embodiments of the present disclosure have been described above. However, these embodiments are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:
1. A semiconductor device, comprising:
a vertical channel portion on a substrate;
source and drain portions located at an upper end of the channel portion and a lower end of the channel portion relative to the substrate; and
a first gate stack on a first side of the channel portion in a lateral direction, and a second gate stack on a second side of the channel portion in the lateral direction, wherein the second side is opposite to the first side,
wherein a first gate dielectric layer in the first gate stack partially overlaps with a second gate dielectric layer in the second gate stack so as to form a stack of the first gate dielectric layer and the second gate dielectric layer, and a thickness of at least part of the stack is a sum of a thickness of the first gate dielectric layer and a thickness of the second gate dielectric layer.

2. The semiconductor device according to claim 1, wherein the channel portion comprises a curved nanosheet or nanowire with a C-shaped section.

3. The semiconductor device according to claim 1, wherein a part of each of the first gate stack and the second gate stack at least close to the channel portion is substantially coplanar with the channel portion.

4. The semiconductor device according to claim 2, wherein the curved nanosheet or nanowire has a substantially uniform thickness.

5. The semiconductor device according to claim 1, wherein an overlapping portion of the first gate dielectric layer and the second gate dielectric layer is different from parts of the first gate dielectric layer and the second gate dielectric layer facing the channel portion.

6. The semiconductor device according to claim 1, wherein the channel portion has a stress in a vertical direction.

7. The semiconductor device according to claim 1, wherein a lattice constant of a material of the channel portion is different from a lattice constant of said material without being strained.

8. The semiconductor device according to claim 6, wherein
the semiconductor device is a n-type MOSFET, the channel portion has a tensile stress or a tensile strain in the vertical direction, or in the vertical direction, a lattice constant of a material of the channel portion is greater than a lattice constant of said material without being strained; or
the semiconductor device is a p-type MOSFET, the channel portion has a compressive stress or a compressive strain in the vertical direction, or in the vertical direction, a lattice constant of a material of the channel portion is less than a lattice constant of said material without being strained.

9. The semiconductor device according to claim 1, further comprising another semiconductor layer arranged side by side with the channel portion.

10. The semiconductor device according to claim 1, wherein:
the channel portion comprises a first surface and a second surface opposite to each other, and a third surface and a fourth surface opposite to each other,
the first gate dielectric layer extends along the first surface, the third surface and the fourth surface, and
the second gate dielectric layer extends along the second surface and along a part of the first gate dielectric layer extending along the third surface and the fourth surface.

11. An electronic apparatus, comprising the semiconductor device according to claim 1.

12. The electronic apparatus according to claim 11, wherein the electronic apparatus comprises a smart phone, a personal computer, a tablet computer, a wearable smart apparatus, an artificial intelligence apparatus, or a mobile power supply.

* * * * *